US010302970B2

(12) United States Patent
Toner et al.

(10) Patent No.: US 10,302,970 B2
(45) Date of Patent: May 28, 2019

(54) ELECTRONIC OPHTHALMIC LENS WITH OSCILLATOR FREQUENCY ADJUSTMENT

(71) Applicant: Johnson & Johnson Vision Care, Inc., Jacksonville, FL (US)

(72) Inventors: Adam Toner, Jacksonville, FL (US); Randall B. Pugh, St. Johns, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 455 days.

(21) Appl. No.: 14/967,961

(22) Filed: Dec. 14, 2015

(65) Prior Publication Data

US 2017/0168322 A1   Jun. 15, 2017

(51) Int. Cl.
| | |
|---|---|
| *H03B 5/10* | (2006.01) |
| *H03J 7/04* | (2006.01) |
| *H03L 7/099* | (2006.01) |
| *G02C 11/00* | (2006.01) |
| *H03L 7/085* | (2006.01) |
| *G02C 7/04* | (2006.01) |
| *H03L 7/00* | (2006.01) |

(52) U.S. Cl.
CPC ............... *G02C 11/10* (2013.01); *G02C 7/04* (2013.01); *H03L 7/00* (2013.01); *H03L 7/085* (2013.01)

(58) Field of Classification Search
CPC .. G02C 11/10; G02C 7/04; H03L 7/00; H03L 7/085
USPC ........................................................ 331/177
See application file for complete search history.

(56) References Cited

U.S. PATENT DOCUMENTS

| | | | |
|---|---|---|---|
| 7,920,663 B1 | 4/2011 | Stevens | |
| 7,931,832 B2 | 4/2011 | Pugh | |
| 8,894,696 B2 | 11/2014 | Hurst | |
| 9,184,698 B1 | 11/2015 | Wiser et al. | |
| 2006/0223454 A1 | 10/2006 | Westwick | |
| 2007/0090883 A1 | 4/2007 | Yang | |
| 2008/0007364 A1* | 1/2008 | Chiba | H03B 5/1228 331/177 V |
| 2011/0279658 A1 | 11/2011 | Masuda et al. | |
| 2014/0009282 A1 | 1/2014 | Baloa Welzien | |
| 2014/0354942 A1 | 12/2014 | Pugh | |

FOREIGN PATENT DOCUMENTS

| | | |
|---|---|---|
| EP | 2647336 A1 | 10/2013 |
| EP | 2 772 791 A1 | 9/2014 |

OTHER PUBLICATIONS

Search Report for EP 16 20 3712 dated Oct. 30, 2018.

* cited by examiner

*Primary Examiner* — Richard Tan

(57) ABSTRACT

An eyelid position sensor system for an ophthalmic lens comprising an electronic system is described herein for adjusting an oscillator frequency on the lens. In at least one embodiment, the frequency adjustment is based on at least one signal received by the contact lens. In a further embodiment, the at least one signal includes a signal providing a plurality of transitions to compare to transitions in an oscillator output signal. In at least one embodiment, the source of the external signal is lighting. In at least one embodiment, updating the oscillator frequency between two lenses.

17 Claims, 19 Drawing Sheets

ELECTRONIC OPHTHALMIC LENS WITH OSCILLATOR FREQUENCY ADJUSTMENT

BACKGROUND OF THE INVENTION

1. Field of the Invention

The present invention relates to a powered or electronic ophthalmic lens, and more particularly, to a powered or electronic ophthalmic lens having hardware and software for adjusting and/or correcting an oscillator frequency of an oscillator on the electronic ophthalmic lens.

2. Discussion of the Related Art

As electronic devices continue to be miniaturized, it is becoming increasingly more likely to create wearable or embeddable microelectronic devices for a variety of uses. Such uses may include monitoring aspects of body chemistry, administering controlled dosages of medications or therapeutic agents via various mechanisms, including automatically, in response to measurements, or in response to external control signals, and augmenting the performance of organs or tissues. Examples of such devices include glucose infusion pumps, pacemakers, defibrillators, ventricular assist devices and neurostimulators. A new, particularly useful field of application is in ophthalmic wearable lenses and contact lenses. For example, a wearable lens may incorporate a lens assembly having an electronically adjustable focus to augment or enhance performance of the eye. In another example, either with or without adjustable focus, a wearable contact lens may incorporate electronic sensors to detect concentrations of particular chemicals in the precorneal (tear) film. The use of embedded electronics in a lens assembly introduces a potential requirement for communication with the electronics, for a method of powering and/or re-energizing the electronics, for interconnecting the electronics, for internal and external sensing and/or monitoring, and for control of the electronics and the overall function of the lens.

The human eye has the ability to discern millions of colors, adjust easily to shifting light conditions, and transmit signals or information to the brain at a rate exceeding that of a high-speed internet connection. Lenses, such as contact lenses and intraocular lenses, currently are utilized to correct vision defects such as myopia (nearsightedness), hyperopia (farsightedness), presbyopia and astigmatism. However, properly designed lenses incorporating additional components may be utilized to enhance vision as well as to correct vision defects.

Contact lenses may be utilized to correct myopia, hyperopia, astigmatism as well as other visual acuity defects. Contact lenses may also be utilized to enhance the natural appearance of the wearer's eyes. Contact lenses or "contacts" are simply lenses placed on the anterior surface of the eye. Contact lenses are considered medical devices and may be worn to correct vision and/or for cosmetic or other therapeutic reasons. Contact lenses have been utilized commercially to improve vision since the 1950s. Early contact lenses were made or fabricated from hard materials and were relatively expensive and fragile. In addition, these early contact lenses were fabricated from materials that did not allow sufficient oxygen transmission through the contact lens to the conjunctiva and cornea which potentially could cause a number of adverse clinical effects. Although these contact lenses are still utilized, they are not suitable for all patients due to their poor initial comfort. Later developments in the field gave rise to soft contact lenses, based upon hydrogels, which are extremely popular and widely utilized today. Specifically, silicone hydrogel contact lenses that are available today combine the benefit of silicone, which has extremely high oxygen permeability, with the proven comfort and clinical performance of hydrogels. Essentially, these silicone hydrogel based contact lenses have higher oxygen permeability and are generally more comfortable to wear than the contact lenses made of the earlier hard materials.

Conventional contact lenses are polymeric structures with specific shapes to correct various vision problems as briefly set forth above. To achieve enhanced functionality, various circuits and components have to be integrated into these polymeric structures. For example, control circuits, microprocessors, communication devices, power supplies, sensors, actuators, light-emitting diodes, and miniature antennas may be integrated into contact lenses via custom-built optoelectronic components to not only correct vision, but to enhance vision as well as provide additional functionality as is explained herein. Electronic and/or powered ophthalmic lenses may be designed to provide enhanced vision via zoom-in and zoom-out capabilities, or just simply modifying the refractive capabilities of the lenses. Electronic and/or powered contact lenses may be designed to enhance color and resolution, to display textual information, to translate speech into captions in real time, to offer visual cues from a navigation system, and to provide image processing and internet access. The lenses may be designed to allow the wearer to see in low-light conditions. The properly designed electronics and/or arrangement of electronics on lenses may allow for projecting an image onto the retina, for example, without a variable-focus optic lens, and provide novelty image displays. Alternately, or in addition to any of these functions or similar functions, the contact lenses may incorporate components for the noninvasive monitoring of the wearer's biomarkers and health indicators. For example, sensors built into the lenses may allow a diabetic patient to keep tabs on blood sugar levels by analyzing components of the tear film without the need for drawing blood. In addition, an appropriately configured lens may incorporate sensors for monitoring cholesterol, sodium, and potassium levels, as well as other biological markers. This, coupled with a wireless data transmitter, could allow a physician to have almost immediate access to a patient's blood chemistry without the need for the patient to waste time getting to a laboratory and having blood drawn. In addition, sensors built into the lenses may be utilized to detect light incident on the eye to compensate for ambient light conditions or for use in determining blink patterns.

The proper combination of devices could yield potentially unlimited functionality; however, there are a number of difficulties associated with the incorporation of extra components on a piece of optical-grade polymer. In general, it is difficult to manufacture such components directly on the lens for a number of reasons, as well as mounting and interconnecting planar devices on a non-planar surface. It is also difficult to manufacture to scale. The components to be placed on or in the lens need to be miniaturized and integrated onto just 1.5 square centimeters of a transparent polymer while protecting the components from the liquid environment on the eye. It is also difficult to make a contact lens comfortable and safe for the wearer with the added thickness of additional components.

Given the area and volume constraints of an ophthalmic device such as a contact lens, and the environment in which it is to be utilized, the physical realization of the device must overcome a number of problems, including mounting and interconnecting a number of electronic components on a non-planar surface, the bulk of which comprises optic plastic. Accordingly, there exists a need for providing a mechanically and electrically robust electronic contact lens.

As these are powered lenses, energy or more particularly current consumption, to run the electronics is a concern given battery technology on the scale for an ophthalmic lens. In addition to normal current consumption, powered devices or systems of this nature generally require standby current reserves, precise voltage control and switching capabilities to ensure operation over a potentially wide range of operating parameters, and burst consumption, for example, up to eighteen (18) hours on a single charge, after potentially remaining idle for years. Accordingly, there exists a need for a system that is optimized for low cost, long-term reliable service, safety and size while providing the required power.

In addition, because of the complexity of the functionality associated with a powered lens and the high level of interaction between all of the components comprising a powered lens, there is a need to coordinate and control the overall operation of the electronics and optics comprising a powered ophthalmic lens. Accordingly, there is a need for a system to control the operation of all of the other components that is safe, low-cost, and reliable, has a low rate of power consumption and is scalable for incorporation into an ophthalmic lens.

Powered or electronic ophthalmic lenses may have to account for certain unique physiological functions from the individual utilizing the powered or electronic ophthalmic lens. More specifically, powered lenses may have to account for blinking, including the number of blinks in a given time period, the duration of a blink, the time between blinks and any number of possible blink patterns, for example, if the individual is dosing off. Blink detection may also be utilized to provide certain functionality, for example, blinking may be utilized as a means to control one or more aspects of a powered ophthalmic lens. Additionally, external factors, such as changes in light intensity levels, and the amount of visible light that a person's eyelid blocks out, have to be accounted for when determining blinks. For example, if a room has an illumination level between fifty-four (54) and one hundred sixty-one (161) lux, a photosensor should be sensitive enough to detect light intensity changes that occur when a person blinks.

Ambient light sensors or photosensors are utilized in many systems and products, for example, on televisions to adjust brightness according to the room light, on lights to switch on at dusk, and on phones to adjust the screen brightness. However, these currently utilized sensor systems are not small enough and/or do not have low enough power consumption for incorporation into contact lenses.

It is also important to note that different types of blink detectors may be implemented with computer vision systems directed at one's eye(s), for example, a camera digitized to a computer. Software running on the computer can recognize visual patterns such as the eye open and closed. These systems may be utilized in ophthalmic clinical settings for diagnostic purposes and studies. Unlike the above described detectors and systems, these systems are intended for off-eye use and to look at rather than look away from the eye. Although these systems are not small enough to be incorporated into contact lenses, the software utilized may be similar to the software that would work in conjunction with powered contact lenses. Either system may incorporate software implementations of artificial neural networks that learn from input and adjust their output accordingly. Alternately, non-biology based software implementations incorporating statistics, other adaptive methods, and/or signal processing may be utilized to create smart systems.

To reduce the power consumption on a lens, the lens typically will not continually monitor sensors, but instead monitor the sensors using a sampling rate based on a clock frequency of the circuit. A timing circuit built with the limitations on size, power consumption, weight, etc. typical of an ophthalmic device may have more drift or inherent inaccuracy as compared to, for example, a watch. When a lens is being used to record data with a time representation or to perform a function at a particular future time, the accuracy of the clock frequency becomes more important to the operation of the lens.

Accordingly, there exists a need for a means and method for adjusting an oscillator frequency of a clock on an electronic ophthalmic lens, and more particularly adjusting the oscillator frequency of the clock on an electronic ophthalmic lens to a more accurate time-base to account for manufacturing tolerances.

SUMMARY OF THE INVENTION

The electronic ophthalmic lens with clock frequency adjustment in accordance with at least one embodiment according to the present invention overcomes the limitations associated with the prior art as briefly described above. This clock frequency adjustment functionality may be integrated into a contact lens. The clock frequency adjustment facilitates more accurate data collection in at least one embodiment.

In at least one embodiment, the present invention is directed to a powered ophthalmic lens. The powered ophthalmic lens includes a contact lens, a system controller configured to control operation of the lens and sample any sensors present on the lens, a timing circuit, and a communications circuit. In at least one embodiment, the contact lens includes an optic zone and a peripheral zone in which the electrical components are located. In an alternative embodiment, the eyelid position sensor system includes a strip sensor in place of the plurality of individual sensors.

In at least one embodiment, the present invention is directed to a powered ophthalmic lens. The powered ophthalmic lens includes an intraocular lens, a system controller configured to control operation of the lens and sample any sensors present on the lens, a timing circuit, and a communications circuit.

In at least one embodiment, a method for updating an oscillator frequency of an oscillator residing in a contact lens, said method includes: receiving by a system controller on the contact lens at least one signal from an external source providing information allowing for adjustment of the oscillator frequency of the oscillator; upon receipt of the signal, computing an adjustment to the oscillator frequency based on information contained in the at least one signal, adjusting the oscillator frequency according to the computed adjustment. In a further embodiment, computing and adjusting include after a period of time, counting a number of transitions in the at least one signal from the external device for a predetermined time period; computing and comparing the transition count to an expected count for the predetermined period; adjusting the clock frequency down when the transition count is low; adjusting the clock frequency up when the transition count is high. In another embodiment, the at least one signal includes two signals spaced in time by a predetermined amount from each other; the at least one signal includes information regarding the current time; calculating the adjustment for the clock frequency includes determining a reference transition count based on the at least one signal that should have occurred between the two signals by the system controller, determining a number of transitions in an oscillator output that occurred between the two signals by the system controller, and comparing the number of transitions to the reference transition count.

In a further embodiment to any of the above embodiments, the method further includes: updating a clock in the contact lens to match the time contained in the at least one signal where the information is a pilot signal; adjusting the oscillator frequency up when the time on the clock prior to updating was slow compared to the updated time; and adjusting the oscillator frequency down when the time on the clock prior to updating was fast compared to the updated time. In a further embodiment, the method further includes recording a base time in memory by the system controller, where the base time is at least one of an initial operation time for the contact lens and a last update time for the contact lens, and wherein adjusting the oscillator frequency includes determining an update time differential between the times used to adjust the oscillator frequency of the oscillator, determining a run time differential between the on the clock prior to updating and the base time, determining a time drift based on the relationship between the update time differential and the run time differential, and adjusting the oscillator frequency of the oscillator based on that relationship.

In a further embodiment to the first embodiment, the receiving of the at least one signal includes detecting with the at least one photosensor light; counting with the system controller the number of transitions of light over a predetermined time period; counting with the system controller the number of transitions in the output from the oscillator during the same predetermined time period; and normalizing at least one of the transition counts to match a frequency of the other transition count prior to comparing transition counts where the transition count of the light is the information contained in the at least one signal, and wherein the light transitions are flickers of the light.

In a further embodiment to the first embodiment, the external source is indoor lighting having a known frequency, the receiving of the at least one signal includes detecting the light with at least one photosensor, determining whether a brightness of the light matches a light threshold, when the brightness matches the light threshold, the method further includes after receipt of the signal, detecting light with the at least one photosensor, counting with the system controller the number of transitions of light over a predetermined time period to determine a light frequency, normalizing the light frequency to the oscillator frequency prior to comparing the oscillator frequency to information where information is the light frequency. In a further embodiment to the first embodiment, the external source is indoor lighting having a known frequency, the receiving of the at least one signal includes detecting the light with at least one photosensor, the method further includes after receipt of the signal, counting with the system controller the number of transitions of light over a predetermined time period to determine a light frequency, normalizing the light frequency to the oscillator frequency prior to comparing the oscillator frequency to information where information is the light frequency. In a further embodiment to either of the previous two embodiments, the indoor lighting is at least one of fluorescent lighting and LED lighting. In a further embodiment to the other embodiments of this paragraph, the method further includes receiving an input by the contact lens identifying the known frequency for fluorescent lighting. In a further embodiment, the input is at least one of detection of a blink pattern template and a transmission from another external source other than the fluorescent lighting.

In a further embodiment to the first embodiment, the external source is indoor lighting having a known frequency, the receiving of the at least one signal includes detecting the light with at least one photosensor, determining whether a brightness of the light matches a light threshold, when the brightness matches the light threshold, the method further comprising after receipt of the signal, detecting light with the at least one photosensor, counting with the system controller the number of transitions of light over a predetermined time period to determine a light frequency, normalizing the oscillator frequency to the lighting frequency prior to comparing the oscillator frequency to information where information is the number of cycles of light.

In a further embodiment to any of the previous embodiments, the method further includes transmitting a synch signal to a second contact lens having at least one of a coded signal and a plurality of zeros and ones; and adjusting an oscillator frequency on the second contact lens based on the synch signal received from the first contact lens. In a further embodiment, the method further includes: transmitting a drift level from the second contact lens to the first contact lens, transmitting from the first contact lens to the second contact lens a second synch signal having at least one of a coded signal and a plurality of zeros and ones, adjusting the oscillator frequency on the second contact lens based on the second synch signal received from the first contact lens, transmitting an updated drift level from the second contact lens to the first contact lens, comparing drift levels with the first contact lens, when a difference between drift levels is greater than a drift threshold, repeating transmitting the second synch signal, adjusting the oscillator frequency in response to the second synch signal, and transmitting the updated drift level. In a further embodiment to any of the embodiments of the previous paragraphs, the method further includes sending a synch ping from the contact lens to a second contact lens; setting an accumulator to zero on the second contact lens; counting each cycle with the accumulator on the second contact lens; sending a second synch ping from the contact lens to the second contact lens, comparing contents of the accumulator to a ping threshold with a system controller on the second contact lens; and adjusting the clock frequency on the second contact lens based on the comparison with the system controller on the second contact lens.

In a further embodiment to any of the previous embodiments, adjusting the oscillator frequency includes adjusting a register electrically connected to the oscillator. In a further embodiment to any of the previous embodiments, adjusting the oscillator frequency includes adjusting at least one of a variable resistor and a variable capacitor to change the oscillator frequency. In a further embodiment to any of the embodiments, the external source is at least one of a cellular telephone, a cellular telephone tower, an over-the-air broadcast signal, a WiFi base station, a LiFi node, and an ad hoc wireless network node. In a further embodiment to any of the above embodiments, the method further includes requesting at least one signal from the external source.

In at least one embodiment, a method for updating a clock residing on a contact lens, said method includes: transmitting a time signal from a system controller through a transmitter on the contact lens to an external device; receiving on the external device the time signal; comparing on the external device the received time signal with a current time on a clock on the external device to determine a time correction; when the time correction is more than a threshold: transmitting a time correction signal based on the time correction from the external device to the contact lens, receiving the time correction signal by the system controller on the contact lens, and updating the time on the contact lens by the system controller based on the time correction signal; and when the time correction is less than or equal to the threshold, transmitting a signal from the external device to the system controller that the time is correct. In a further embodiment, the time correction signal includes the time correction. In an alternative embodiment, the time correction signal includes a frequency adjustment based on adjusting an oscillator frequency for an oscillator in the contact lens up when the time correction shows the time on the contact lens is behind the time on the external device; adjusting the oscillator frequency for the oscillator in the contact lens down when the time correction shows the time on the contact lens is ahead of the time on the external device.

In at least one embodiment, a method for updating a clock residing on a contact lens, said method includes: recording a base time in memory by the system controller, where the base time is at least one of an initial operation time for the contact lens and a last update time for the contact lens; receiving by a system controller on the contact lens at least one signal from an external source an external current time; determining a run time differential between the base time and a current time on the clock; determining an update time differential between the current time on the clock and the external current time; updating the clock to the external current time received by the system controller; determining a time drift based on the relationship between the update time differential and the run time differential; and adjusting an oscillator frequency based on that relationship.

In at least one embodiment, a method for synchronizing frequencies between two lenses, said method includes: transmitting from a first contact lens a synch signal to a second contact lens having at least one of a coded signal and a plurality of zeros and ones; adjusting an oscillator frequency on the second contact lens based on the synch signal received from the first contact lens; transmitting a drift level from the second contact lens to the first contact lens, transmitting from the first contact lens to the second contact lens a second synch signal having at least one of a coded signal and a plurality of zeros and ones, adjusting the oscillator frequency on the second contact lens based on the second synch signal received from the first contact lens, transmitting an updated drift level from the second contract lens to the first contact lens, comparing drift levels with the first contact lens, when a difference between drift levels is greater than a drift threshold, repeating transmitting the second synch signal, adjusting the oscillator frequency in response to the second synch signal, transmitting the updated drift level, and comparing drift levels.

Control of a powered ophthalmic lens may be accomplished through a manually operated external device that communicates with the lens wirelessly, such as a hand-held remote unit. Alternately, control of the powered ophthalmic lens may be accomplished via feedback or control signals directly from the wearer. For example, sensors built into the lens may detect blinks and/or blink patterns. Based upon the pattern or sequence of blinks, the powered ophthalmic lens may change operation state. Alternatively, the sensors may include, for example, a pressure sensor, a reed switch, a salinity sensor, a biosensor, and a capacitive sensor to provide a signal indicating the lens has been inserted.

The blink detection method is a component of the system controller which detects characteristics of blinks, for example, if the lid is open or closed, the duration of the blink open or closed, the inter-blink duration, and the number of blinks in a given time period. The method in accordance with at least one embodiment relies on sampling light incident on the eye at a certain sample rate. Pre-determined blink patterns are stored and compared to the recent history of incident light samples. When patterns match, the blink detection method triggers activity in the system controller, for example, to switch to a particular operation state.

The blink detection method and associated circuitry in at least one embodiment operates over a reasonably wide range of lighting conditions and is able to distinguish an intentional blink sequence or closed eyelids from involuntary blinks. It is also preferred that minimal training is required to utilize intentional blinks to activate and/or control the powered ophthalmic lens. The blink detection method and associated circuitry of at least one embodiment provides a safe, low cost, and reliable means and method for detecting blinks via a powered or electronic contact lens, which also has a low rate of power consumption and is scalable for incorporation into an ophthalmic lens, for at least one of activating or controlling a powered or electronic ophthalmic lens.

BRIEF DESCRIPTION OF THE DRAWINGS

The foregoing and other features and advantages of the invention will be apparent from the following, more particular description of preferred embodiments of the invention, as illustrated in the accompanying drawings.

DETAILED DESCRIPTION OF THE PREFERRED EMBODIMENTS

Figure 1A:
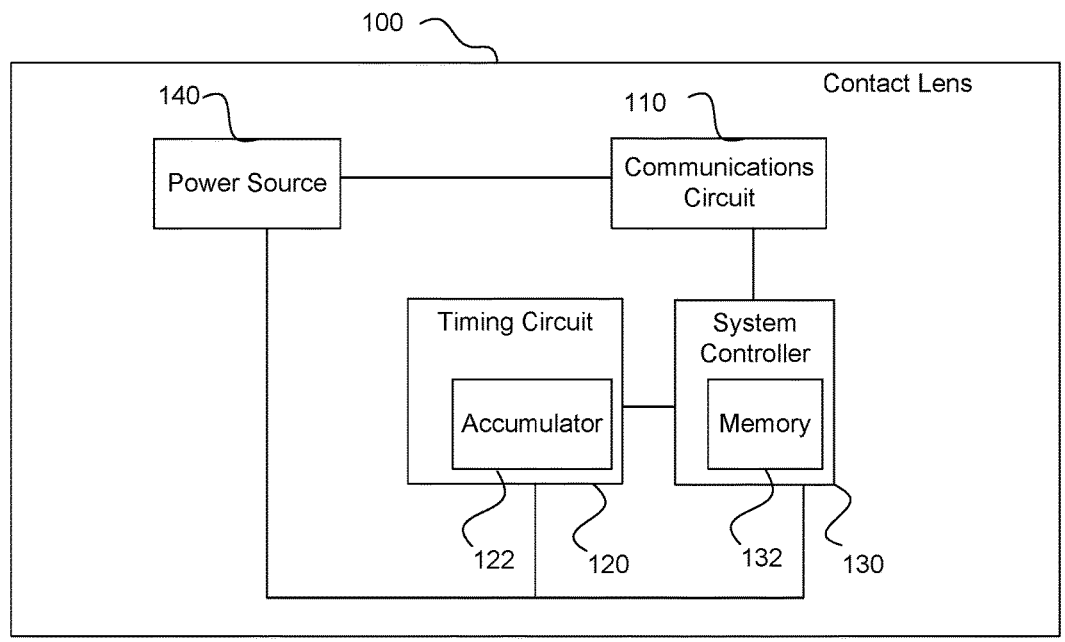
FIGS. 1A and 1B illustrate a contact lens according to at least two embodiments of the present invention.

Conventional contact lenses are polymeric structures with specific shapes to correct various vision problems as briefly set forth above. To achieve enhanced functionality, various circuits and components may be integrated into these polymeric structures. For example, control circuits, microprocessors, communication devices, power supplies, sensors, alert mechanisms, light-emitting diodes, and miniature antennas may be integrated into contact lenses via custom-built optoelectronic components to not only correct vision, but to enhance vision as well as provide additional functionality as is explained herein. Electronic and/or powered contact lenses may be designed to provide enhanced vision via zoom-in and zoom-out capabilities, or just simply modifying the refractive capabilities of the lenses. Electronic and/or powered contact lenses may be designed to enhance color and resolution, to display textual information, to translate speech into captions in real time, to offer visual cues from a navigation system, and to provide image processing and internet access. The lenses may be designed to allow the wearer to see in low light conditions. The properly designed electronics and/or arrangement of electronics on lenses may allow for projecting an image onto the retina, for example, without a variable focus optic lens, provide novelty image displays and even provide wakeup alerts. In addition, sensors built into the lenses may be utilized to detect light incident on the eye to compensate for ambient light conditions or for use in determining blink patterns and whether the wearer is asleep or awake.

In at least one embodiment the powered or electronic contact lens includes the elements to correct and/or enhance the vision of patients with one or more of the above-described vision defects or otherwise perform a useful ophthalmic function. In addition, the electronic contact lens may be utilized simply to enhance normal vision or provide a wide variety of functionality as described in this disclosure. The electronic contact lens may have a variable-focus optic lens, an assembled front optic embedded into a contact lens or just simply embedding electronics without a lens for any suitable functionality. The electronic lens may be incorporated into any number of contact lenses as described above. In addition, intraocular lenses may also incorporate the various components and functionality described herein. However, for ease of explanation, the disclosure will focus on an electronic contact lens to correct vision defects intended for single-use daily disposability.

The present invention may be employed in a powered ophthalmic lens or powered contact lens having an electronic system, which actuates a variable-focus optic or any other device or devices configured to implement any number of numerous functions that may be performed. The electronic system includes one or more batteries or other power sources, power management circuitry, one or more sensors, clock generation circuitry, control methods and circuitry, and lens driver circuitry. The complexity of these components may vary depending on the required or desired functionality of the lens.

Control of an electronic or a powered ophthalmic lens may be accomplished through a manually operated external device that communicates with the lens, such as a hand-held remote unit. For example, a fob may wirelessly communicate with the powered lens based upon manual input from the wearer. Alternately, control of the powered ophthalmic lens may be accomplished via feedback or control signals directly from the wearer. For example, sensors built into the lens may detect blinks, blink patterns, and/or eyelid closures. Based upon the pattern or sequence of blinks, the powered ophthalmic lens may change operation state. A further alternative is that the wearer has no control over operation of the powered ophthalmic lens.

FIG. 1A illustrates a system that provides for adjusting a clock frequency of a timing circuit on the contact lens in at least one embodiment. The illustrated system includes a contact lens 100 having a body (or an insert) encapsulating at least a portion of a communications circuit 110, a timing circuit 120, and a system controller 130 in electrical communication with the communications circuit 110 and the timing circuit 120.

The communications circuit 110 facilitates communication between the system controller 130 and the external source of timing information. Examples of the external source include the wearer of the contact lens, a fob, indoor lighting such as fluorescent lighting and light-emitting diode (LED) lighting, a cellular telephone, a smartphone, smartwatch, a computer, a mobile computing device including a tablet, a cellular telephone tower, an over-the-air broadcast signal (e.g., television, radio, or land mobile service), the Global Positioning System (GPS), a WiFi base station, a LiFi node, and an ad hoc wireless network. A further example is any source that is capable of providing a time signal, which in at least one embodiment is an industry-standard time signal and/or a trusted time signal. The communications circuit 110 in at least one embodiment includes an antenna and a receiver. In a further alternate embodiment, the communications circuit 110 may include a transmitter in addition to the receiver or a transceiver.

Figure 1B:
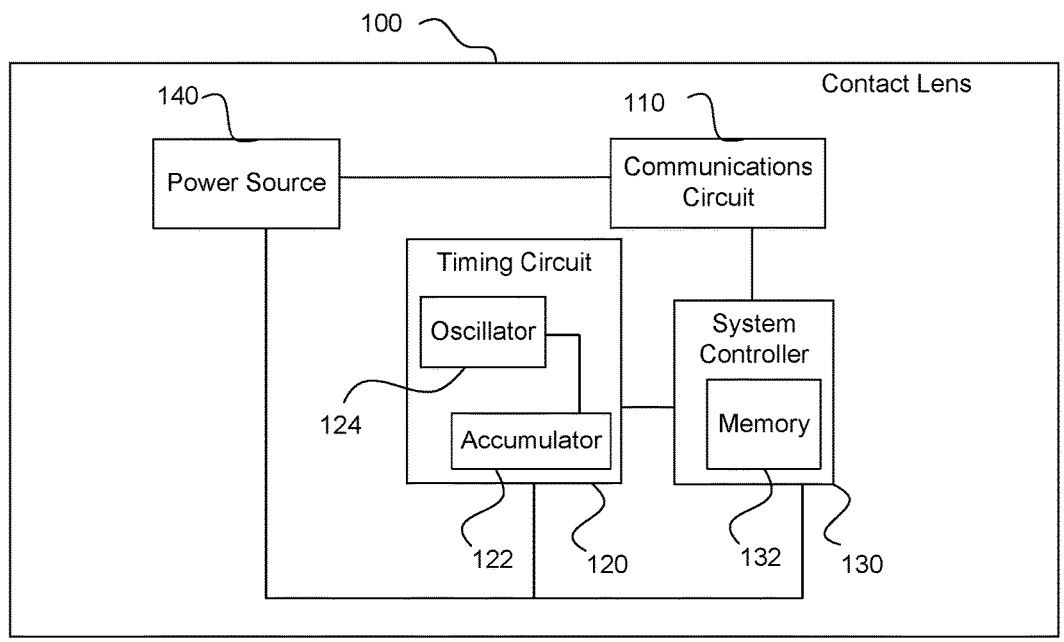

The timing circuit 120 provides a clock signal for operation of the electronic components on the contact lens requiring a clock signal. The timing circuit 120 in at least one embodiment includes an accumulator 122 for tracking the passing of time. An example of an accumulator is a register acting as a counter. In an alternative embodiment, the accumulator 122 is set to a value approximating the time in the future when the alarm is to be provided to the wearer and works in reverse counting down from that value, which leads to the system controller 130 performing a comparison of the reading to zero to determine when to send the alert signal. In alternative embodiments, the timing circuit 120 as illustrated in FIG. 1B may include an oscillator 124 having a crystal, for example quartz, a resistor-capacitor (RC), an inductor-capacitor (LC), and/or a relaxation circuitry. In a further embodiment, the oscillator frequency is at least partially determined by a variable capacitor including a selectable array of capacitors, a varactor diode, and/or a variable resistor. In at least one embodiment, a register in electrical communication with the oscillator is adjusted, and the contents of the register are then decoded to provide adjustment of variable components leading to adjustment of the oscillator frequency.

The system controller 130 provides for the operation of the electronic components present on the contact lens 100 from obtaining readings from sensors to sending control signals for operation of actuators or alert mechanisms that may be present on the contact lens 100 in addition to the communications circuit 110 and the timing circuit 120. In at least one embodiment, the system controller 130 includes a memory 132.

Also illustrated, in FIGS. 1A and 1B, is a power source 140, which supplies power for numerous electrical components on the contact lens 100. The power may be supplied from a battery, energy harvester, or other suitable means as is known to one of ordinary skill in the art. Essentially, any type of power source 140 may be utilized to provide reliable power for all other components of the system. In an alternative embodiment, the communications circuit 110 is omitted and the communication functionality is provided by an energy harvester that acts as the receiver for the time signal, for example in an alternative embodiment, the energy harvester is a solar cell or a radio frequency (RF) receiver, which receives both power and a time-base signal (or indication). In a further alternative embodiment, the energy harvester is an inductive charger, in which power is transferred in addition to data such as RFID. In one or more of these alternative embodiments, the time signal could be inherent in the harvested energy, for example N*60 Hz in inductive charging or lighting.

Figure 2A:
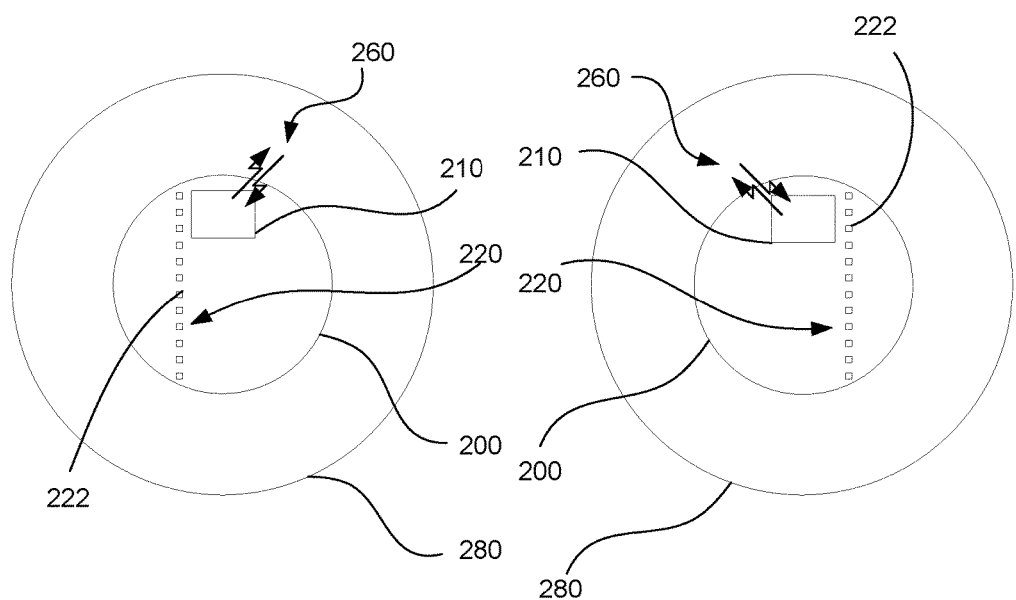
FIG. 2A illustrates a diagrammatic representation of two contact lenses having a communication channel for synchronizing operation between two contact lenses in accordance with at least one embodiment of the present invention.
Figure 2B:
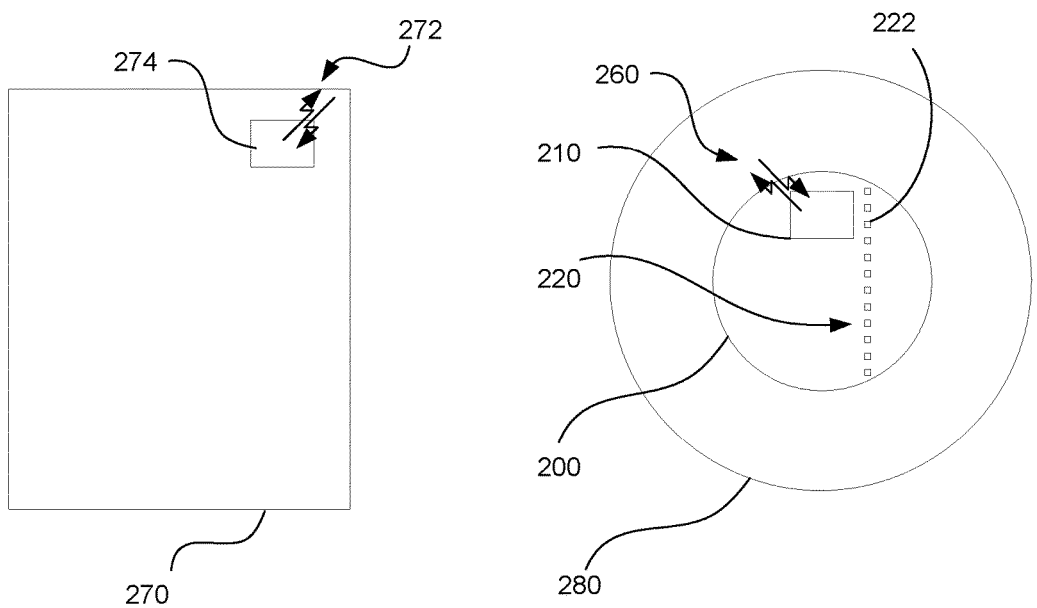
FIG. 2B illustrates a diagrammatic representation of a communication channel between a contact lens and an external device in accordance with at least one embodiment of the present invention.

FIG. 2A illustrates a system in which two eyes 280 are at least partially covered with contact lenses 200. Sensor arrays 220 are present in both of the contact lenses 200 to determine lid position, as described with respect to FIGS. 17A-18B. In this embodiment, the contact lenses 200 each include an electronic communication component 210, which is an example of a communications circuit 110 in FIG. 1A. Electronic communication component 210 in each contact lens 200 permits two-way communication to take place between the contact lenses 200. The electronic communication components 210 may include RF transceivers, antennas, interface circuitry for photosensors 222, and associated or similar electronic components. The communication channel represented by line 260 may include RF transmissions at the appropriate frequency and power with an appropriate data protocol to permit effective communication between the contact lenses 200. Transmission of data between the two contact lenses 200 may, for example, verify that both lids have closed in order to detect a true, purposeful blink rather than a wink or involuntary blink. The transmission may also allow a system to determine if both eyelids have closed by a similar amount, for example, that which is associated with a user reading up-close. Data transmission 272 may also take place from and/or to an external device 270, for example, spectacle glasses, or a smartphone (or other processor based system) as illustrated, for example in FIG. 2B. In at least one embodiment, the electronic communication components 210, for example, allow for the transmission of a data synch request (or ping) to and receiving a response from the smartphone (or other external device) 270 having a communications component 274. As such the electronic communication components 210 may be present on just one lens in at least one alternative embodiment.

Figure 3A:
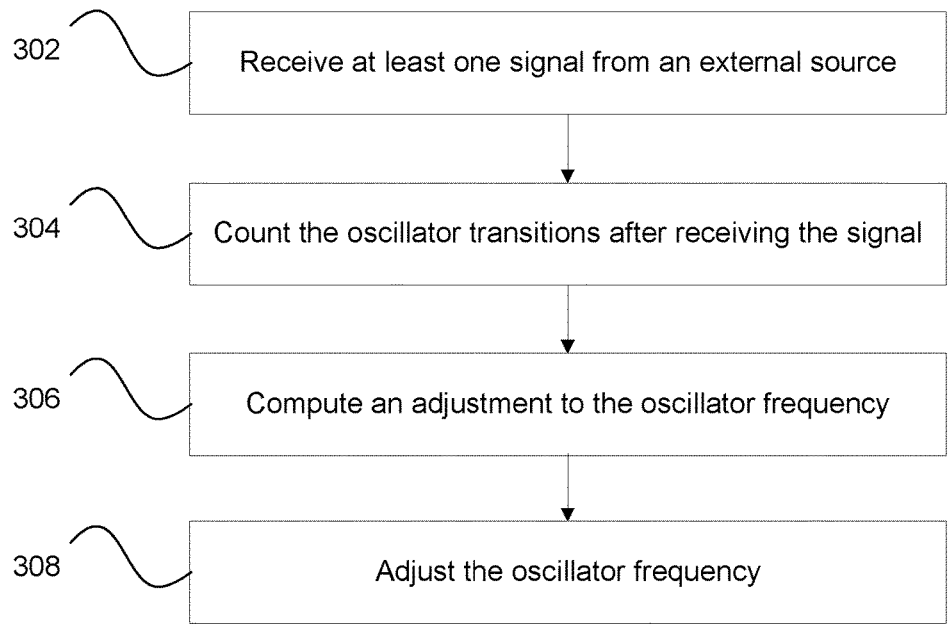
FIGS. 3A-3C illustrate flowcharts for methods for updating an oscillator frequency of a clock in a contact lens in accordance with at least three embodiments of the present invention.
Figure 3B:
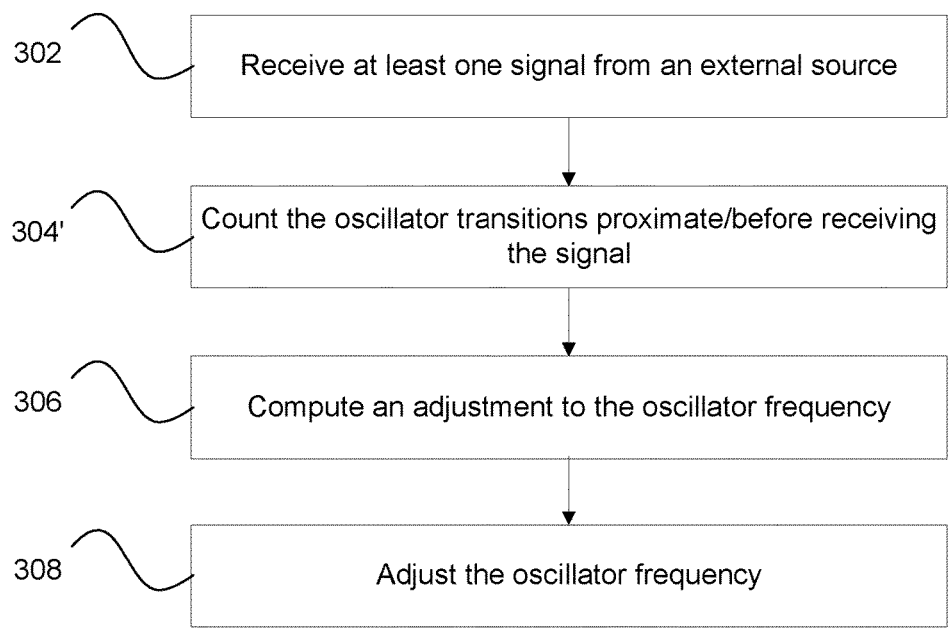

FIGS. 3A and 3B illustrate methods for updating an oscillator frequency of an oscillator residing in a contact lens, or alternatively or in addition a time maintained by the clock. The system controller on the contact lens receives at least one signal from an external source, 302. The signal provides information allowing for adjustment of the oscillator frequency. Examples of the types of information that may be present in the signal include a current time, a time ping, a pilot signal, a first ping signal followed by a second ping signal at a predetermined time after the first ping signal, a periodic signal having a detectable frequency, a frequency adjustment, a series of light signals from a light turning on and off over a period of time, a light flicker, a series of blinks from the wearer that in at least one embodiment are timed by a clock or metronome, and a confirmation that the contact lens has a sufficiently accurate time that falls within a threshold.

The system controller either after receiving the signal (FIG. 3A) or proximate or before (FIG. 3B) counts the oscillator transitions from zero to one and/or from one to zero from a zero count, 304, 304'. In an alternative embodiment, the system controller determines the oscillator frequency by decoding an absolute or relative time or frequency value embedded within a communication from an external device.

The system controller after receiving the at least one signal computes an adjustment to the oscillator frequency based on the information contained in the at least one signal, 306. In a further embodiment, the system controller computes an oscillator frequency adjustment from comparing the oscillator frequency count to information from the at least one signal. In another embodiment, the system controller computes an oscillator frequency adjustment based on the number of cycles that should have occurred between a pair of received signals to the number of cycles that actually occurred. Using the computed adjustment, the system controller adjusts the oscillator frequency, 308. In at least one embodiment, the oscillator frequency is increased when the oscillator frequency count is smaller than the information and the oscillator frequency is decreased when the oscillator frequency count is larger than the information. Alternatively, the clock frequency is adjusted based on a comparison of the time on the contact lens when compared to a time from an external source.

In an alternative embodiment, the at least one signal, such as a pilot signal, includes a time. In at least one embodiment, the difference between the time on the contact lens and the time in the at least one signal is a time drift. The oscillator frequency is adjusted up when the time on the clock prior to updating was slow compared to the updated time, which in at least one embodiment is the time in the at least one signal. The oscillator frequency is adjusted down when the time on the clock prior to updating was fast compared to the updated time. In at least one embodiment, the amount of adjustment is determined based on the difference (or time drift) as compared to the time since the last update, which in at least one embodiment is maintained in memory such as a register connected to or present in the system controller. In at least one embodiment, the time comparison provides a relationship on which the oscillator frequency is adjusted. In at least one further embodiment, the time on the clock on the contact lens is updated to match the time in the at least one signal.

Figure 3C:
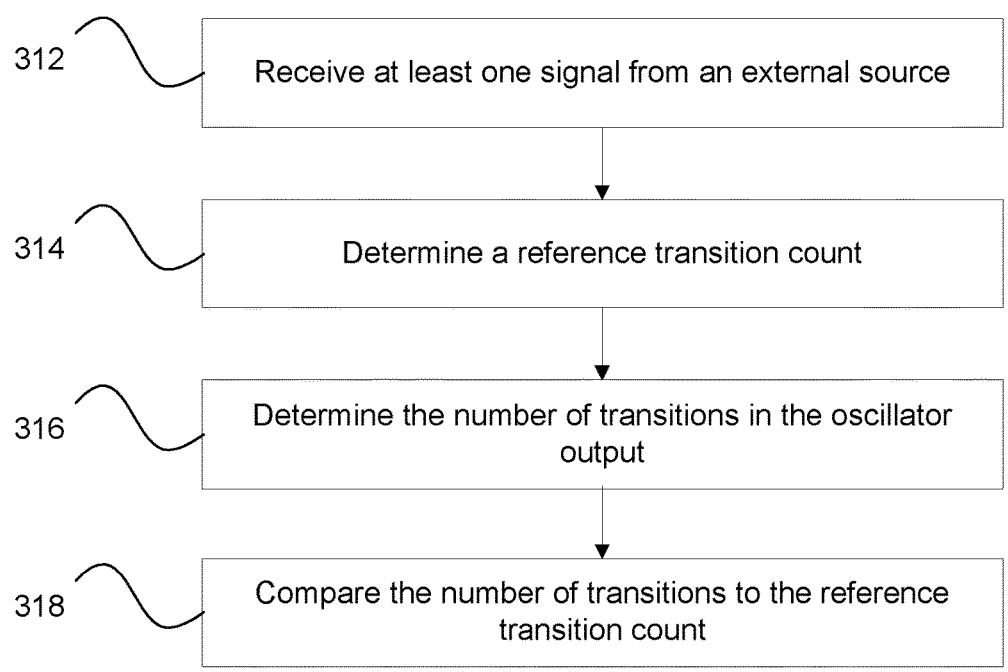

FIG. 3C illustrates a method using two signals that are spaced in time by a predetermined amount of time from each other. The contact lens receives a signal from an external device, 312, which in at least one embodiment the signal includes information regarding the current time. In at least one embodiment, at least one of the signals includes a reference transition count that should occur between the two signals to allow the system controller to determine the reference transition count, 314. The system controller determines the number of transitions in the oscillator output that occur between the two signals, 316. One example of how to determine the number of transitions is by counting the transitions as discussed, for example, in connection with FIGS. 3A and 3B. The system controller compares the number of transitions to the reference transition count, 318, for example to provide the amount of adjustment for the oscillator frequency.

Based on this disclosure and the discussion regarding blink detection later in this disclosure, one of ordinary skill in the art should appreciate that the photosensor/photodetector embodiments can be used to detect light level and changes in light level. See, e.g., FIGS. 6-18B.

In an embodiment where the external source is lighting such as a fluorescent light or LED light that has a known frequency, the receiving of the at least one signal includes detecting, with a photosensor such as the ones used in the blink detection embodiment discussed later, the presence of the lighting. The system controller, in conjunction with the blink detection components, determines whether the brightness of light detected by the photosensor matches a light threshold, which in at least one embodiment is stored in memory that is part of the system controller. When the incident brightness matches or exceeds the light threshold, the method includes additional steps to pull the frequency information from the light. In an alternative embodiment, the system controller does not rely on the light threshold for checking the frequency, but instead if the light brightness is insufficient, then a flicker will likely not be detected otherwise the frequency check will occur.

One example of a method to pull the frequency information includes detecting the light with at least one photosensor, counting with the system controller the number of transitions of light over a plurality of transitions, and then comparing the number of transitions of light detected to a pre-determined value of expected transitions of light. Another example of a method includes detecting the light with at least one photosensor, counting with the system controller the number of transitions of on to off and/or off to on for the light over a predetermined time period, retrieving a value representing the number of oscillator transitions for the predetermined time period, and in at least one embodiment normalizing the oscillator value to the light transition count or vice versa. The normalizing allows for comparing the two sources that will likely be using different frequencies to determine if, over a period of time, the contact lens oscillator frequency is operating at a correct frequency and to provide sufficient information to adjust it if needed. In an alternative embodiment where the frequencies of the contact lens oscillator and the lighting are substantially the same, the normalization of counts may be omitted. In at least one embodiment, the detection of the light allows the system controller to determine the frequency at which the light should be operating and/or the pre-determines value of expected cycles of light. In an alternative embodiment, the system controller receives a signal informing it of a geolocation that can be used to further select the light frequency from memory given the different power line frequencies around the world.

Figure 4A:
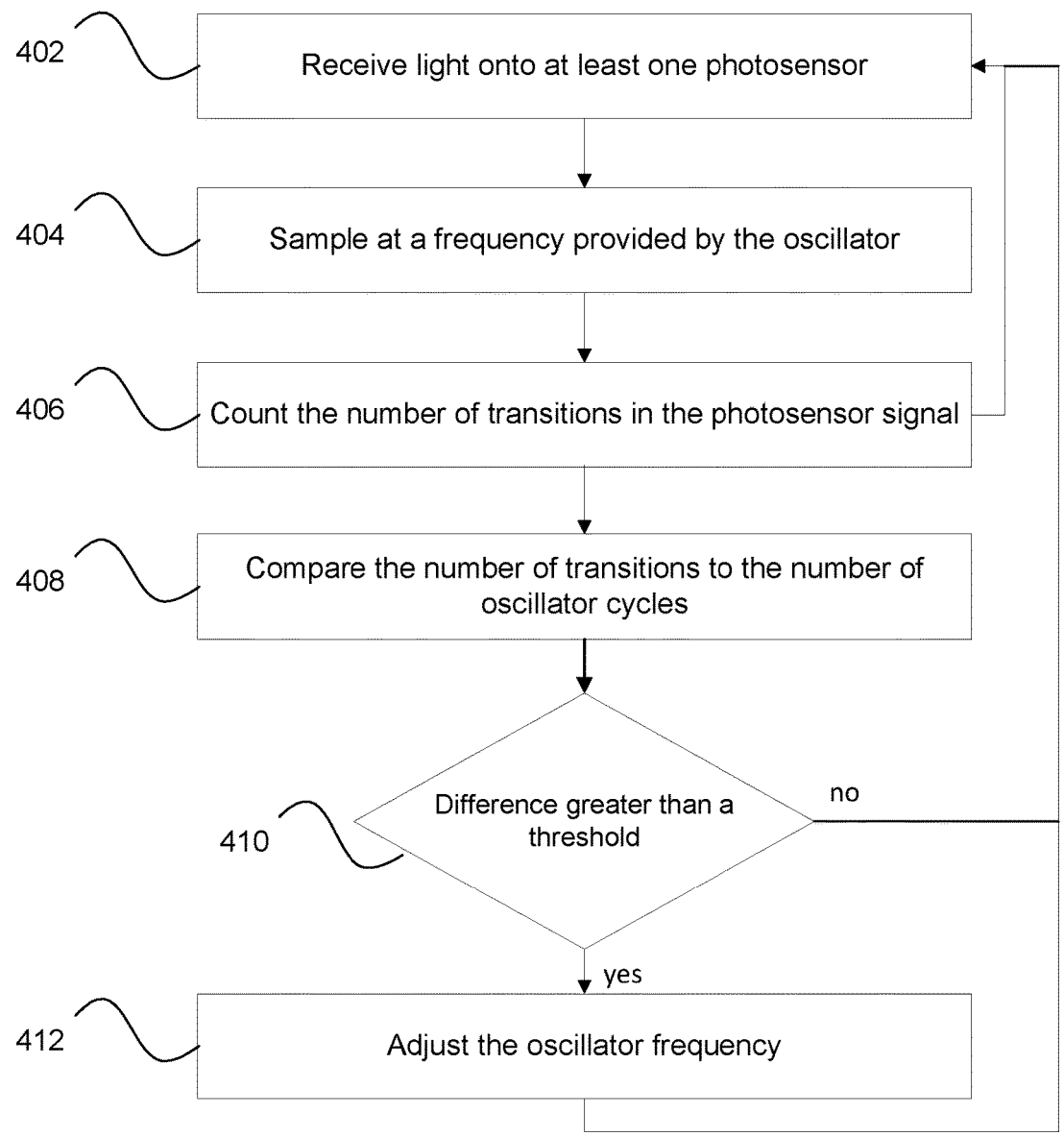
FIG. 4A illustrates a flowchart of another method for updating an oscillator frequency of a clock in a contact lens in accordance with at least one embodiment of the present invention.
Figure 4B:
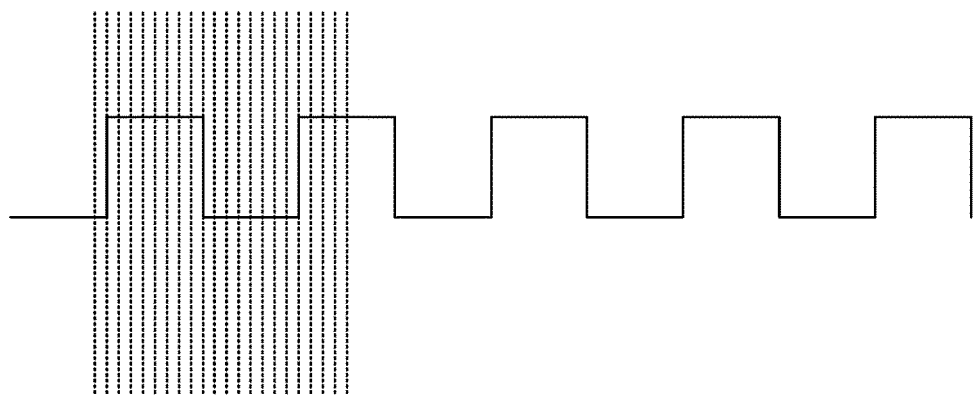
FIGS. 4B-4D illustrate examples of an overlaid oscillator cycle to a reference signal.
Figure 4C:
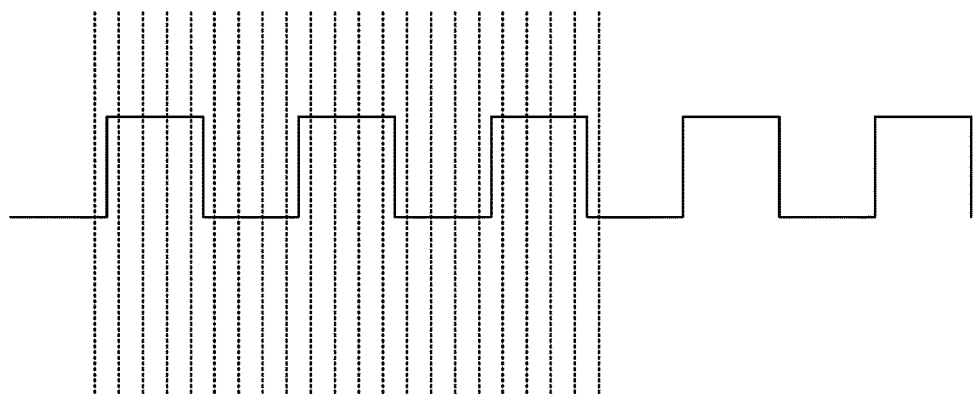
Figure 4D:
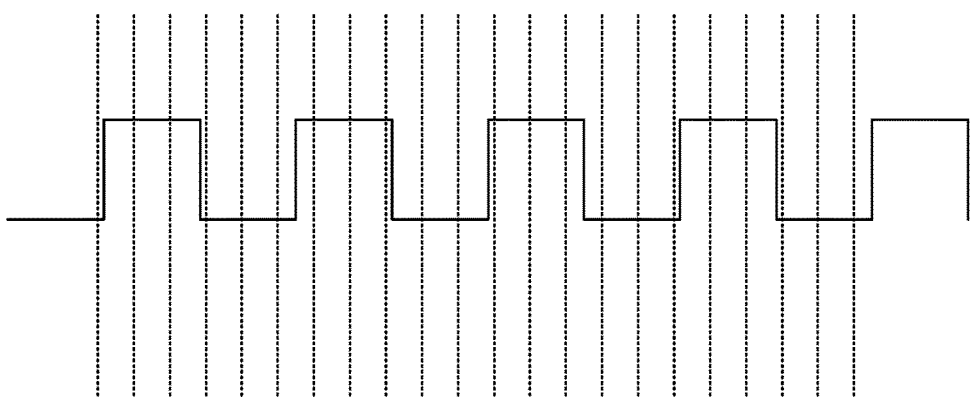

FIG. 4A illustrates a more general approach to the above example for pulling frequency information from a light source. FIGS. 4B-4D illustrate three examples of sampling by a contact lens based on different oscillator frequencies: frequency is too fast, frequency is correct, and frequency is too slow. The contact lens receives light onto at least one photosensor, 402. The signal produced by the at least one photosensor is sampled at a frequency provided by the oscillator, 404. In at least one embodiment, the sampling of the photosensor signal is done over a predetermined time period, while in at least one other embodiment it sampled until a predetermined transitions are detected in the photosensor signal. The system controller counts the number of transitions in the output of the photosensor signal, 406. In at least one embodiment, a flicker in the light produces a light transition, where the flicker is a change in the light brightness in excess of a flicker threshold and in a further embodiment the light going from an on state to an off state and/or from the off state to the on state. Typically, the minimum instantaneous brightness of a fluorescent light will not reach zero during flicker events, but there will be a detectable reduction in instantaneous brightness. After the sampling has concluded, the system controller compares the number of photosensor signal transitions to the number of oscillation cycles, 408. When these two values differ by a predetermined threshold, 410, the oscillator frequency is adjusted, 412. In at least one embodiment, the predetermined threshold is set to zero. In FIGS. 4B-4D, the vertical dashed lines represent sampling events performed by the system controller, the frequency of which is related to the oscillator frequency. FIG. 4B illustrates a situation in which the oscillator frequency would be slowed down. FIG. 4C illustrates a situation in which the oscillator frequency would not be adjusted. FIG. 4D illustrates a situation in which the oscillator frequency would be increased.

Examples of how the system controller may adjust the oscillator frequency include adjusting a register electrically connected to the oscillator in the timing circuit, adjusting a variable resistor in the timing circuit, adjusting a variable capacitor in the timing circuit such as selecting which capacitors in an array are used as part of the circuit, adjusting a current source to an oscillator, adjusting a voltage source to an oscillator, pushing or pulling a variable oscillator, and modifying the settings of a digital oscillator.

In a further embodiment, the contact lens transmits a synch signal to second contact lens where the synch signal has a plurality of zeros and ones. One way to provide for this frequency alignment is by using Manchester decoding.

An example of a method using Manchester decoding begins with a signal being sampled until a data transition or edge is found. In a second step, a determination has to be made as to whether the incoming signal may be aligned with or in phase with the clock that is utilized to determine when samples are taken. At first, successive sample values are examined to find or look for a transition from a 1 to a 0 or from a 0 to a 1. If a transition is found, it is assumed that this may be a mid-symbol transition. If it is in fact a mid-symbol transition, then no additional samples are collected for a specific time period. In other words, one can skip ahead from the mid-symbol transition to the sample time that should be in the middle of the next "first half symbol time." This is a ¾ of a symbol later, or six (6) samples later at 8× oversampling. In a third step, the first two steps are repeated twice to ensure that data symbols are being detected. In a fourth step, the sample count is set to zero and sampling is performed until a data transition or edge is found. If the sample count is lower than the target transition sample count, the receiver sample clock frequency is increased. If the sample count is greater than the target transition sample count, the receiver sample clock frequency is decreased. In a fifth step, the methodology of the second step is repeated. In a sixth step, the fourth and fifth steps are repeated until enough time has elapsed to ensure that the receiver is past the longest run of consecutive 1's allowed. In a seventh step, the sample count is set to zero and the signal is sampled until a data transition or edge is found. Optionally, if the sample count is lower than the target transition sample count, the receiver sample clock frequency may be increased, and if the sample count is greater than the target transition sample count, the receiver sample clock frequency may be decreased. In an eighth step, the methodology of the second step is repeated. In a ninth and final step, the seventh and eighth steps are repeated until the desired number of samples has been collected.

In a further embodiment for communication between a pair of contact lens, the second contact lens transmits a drift level to the first contact lens. The first contact lens responds by transmitting a second synch signal having a plurality of zeros and ones to the second contact lens. The second contact lens decodes the second synch signal to attempt to bring its clock frequency into synch with the clock frequency of the first contact lens prior to transmitting an updated drift level to the first contact lens. As discussed above, one approach to decoding the second synch signal is by using Manchester decoding. The first contact lens compares the drift levels, which in at least one embodiment are stored in registers or other memory. When the first contact lens finds a difference between the drift levels greater than a drift threshold, the method is repeated.

In a further alternative embodiment, the first contact lens brings the oscillator frequency of the second contact lens into synch with its oscillator frequency. The first contact lens sends a synch ping to the second contact lens. The second contact lens sets an accumulator to zero. The second contact lens counts each cycle with the accumulator. The first contact lens sends a second synch ping to the second contact lens. A system controller on the second contact lens compares contents of the accumulator to a ping threshold. The system controller on the second contact lens adjusts the oscillator frequency on the second contact lens based on the comparison.

Figure 5:
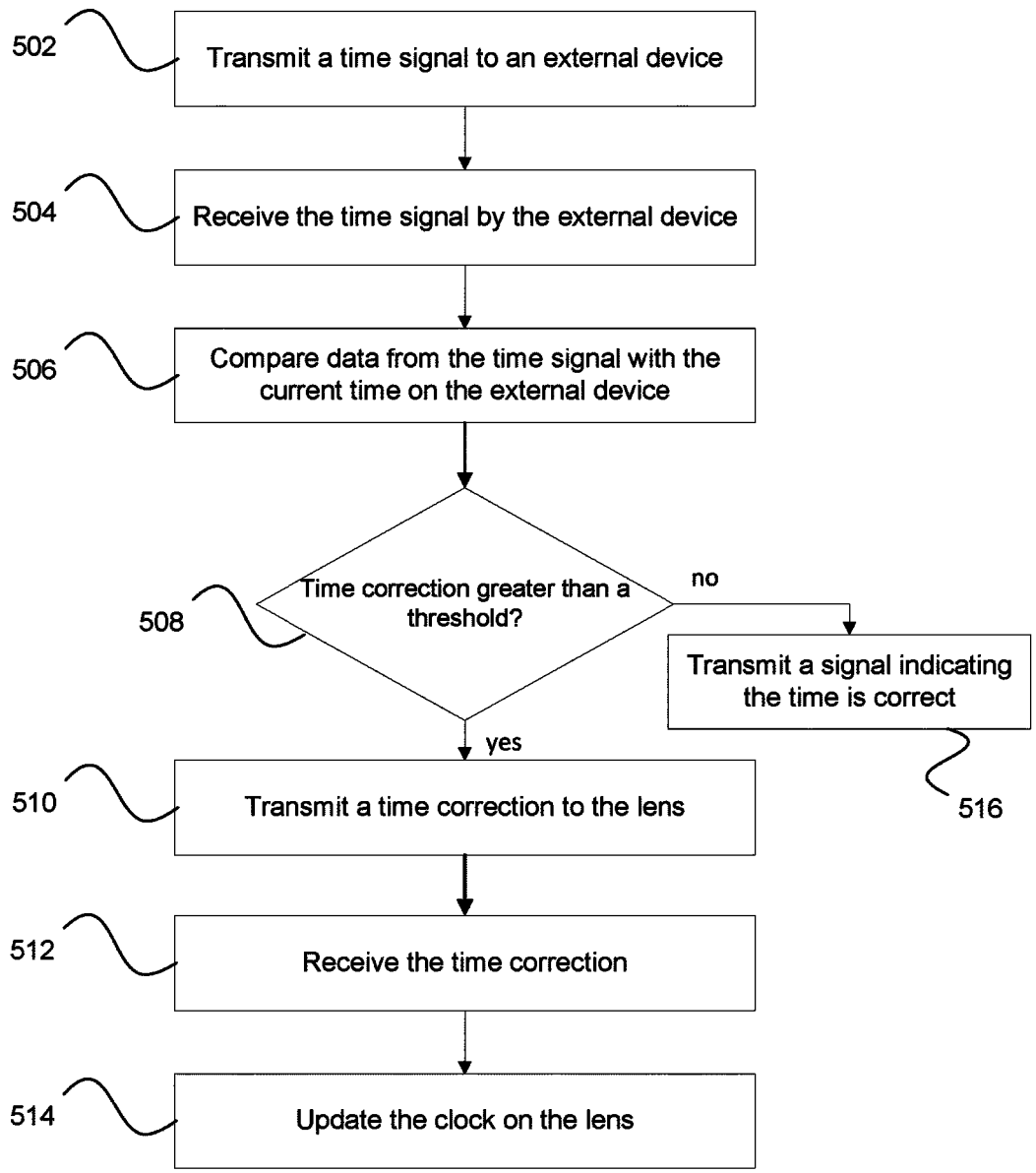
FIG. 5 illustrates a flowchart for a method for updating a clock on a lens in accordance with at least one embodiment of the present invention.

In an alternative embodiment, the contact lens works in conjunction with an external device, which in at least one embodiment is selected from the devices having a processor or other computing capabilities with two-way communication possible from the external sources identified previously. A method for updating an oscillator frequency of an oscillator and/or time on a clock (e.g., timing circuit) residing in a contact lens is illustrated in FIG. 5. A system controller through a transmitter on a contact lens transmits a time signal to an external device, 502. In at least one embodiment, the time signal is the current time as maintained on the contact lens. The external device receives the time signal, 504, and compares it with a current time on a clock on the external device to determine a time correction, 506. When the external device finds that the time correction is more than a threshold, 508, the external device transmits a time correction signal based on the time correction to the contact lens, 510, the system controller on the contact lens receives the time correction, 512, and updates the time on the contact lens, 514. In at least one embodiment, when the time correction is less than or equal to the threshold, the external device transmits a signal to the system controller that the time on the contact lens is correct, 516. In a further embodiment, the time correction signal includes the time correction. In a further alternative embodiment, the time correction signal includes a frequency adjustment calculated based on adjusting the clock frequency up when the time correction shows the time on the contact lens is behind the time on the external device, and adjusting the clock frequency down when the time correction shows the time on the contact is ahead of the time on the external device.

In at least one embodiment, a blink detection method is an aspect of the system controller which detects characteristics of blinks, for example, is the lid open or closed, the duration of the blink, the inter-blink duration, the number of blinks in a given time period, and the duration of lid closure. As mentioned previously, the photodetector blink detection system can also be used to detect light flicker, and in at least one embodiment using light flicker to detect a frequency. The method in accordance with the present invention relies on sampling light incident on the eye at a certain sample rate. Pre-determined blink patterns are stored and compared to the recent history of incident light samples. When patterns match, the blink detection method may trigger activity in the system controller, for example to activate the lens driver to change the refractive power of the lens or to change the operation state of the lens.

Blinking is the rapid closing and opening of the eyelids and is an essential function of the eye. Blinking protects the eye from foreign objects; for example, individuals blink when objects unexpectedly appear in proximity to the eye. Blinking provides lubrication over the anterior surface of the eye by spreading tears. Blinking also serves to remove contaminants and/or irritants from the eye. Normally, blinking is done automatically, but external stimuli may contribute as in the case with irritants. However, blinking may also be purposeful, for example, for individuals who are unable to communicate verbally or with gestures can blink once for yes and twice for no. The blink detection method and system of the present invention utilizes blinking patterns that cannot be confused with normal blinking response. In other words, if blinking is to be utilized as a means for controlling an action, then the particular pattern selected for a given action cannot occur at random; otherwise inadvertent actions may occur. As blink speed and/or frequency may be affected by a number of factors, including fatigue, concentration, boredom, eye injury, medication and disease, blinking patterns for control purposes preferably account for these and any other variables that affect blinking. The average length of involuntary blinks is in the range of about one hundred (100) to four hundred (400) milliseconds. Average adult men and women blink at a rate of ten (10) involuntary blinks per minute, and the average time between involuntary blinks is about 0.3 to seventy (70) seconds. Eyelid movements may also indicate other conditions such as drowsiness as the eyelids have a general trend towards closing over a period of time or are closed for a period of time indicating that the wearer is asleep.

An embodiment of the blink detection method may be summarized in the following steps.

1. Define an intentional "blink sequence" that a user will execute for positive blink detection or that is representative of sleep onset.

2. Sample the incoming light level at a rate consistent with detecting the blink sequence and rejecting involuntary blinks.

3. Compare the history of sampled light levels to the expected "blink sequence," as defined by a blink template of values.

4. Optionally implement a blink "mask" sequence to indicate portions of the template to be ignored during comparisons, e.g. near transitions. This may allow for a user to deviate from a desired "blink sequence," such as a plus or minus one (1) error window, wherein one or more of lens activation, control, and focus change can occur. Additionally, this may allow for variation in the user's timing of the blink sequence.

A blink sequence may be defined as follows:
1. blink (closed) for 0.5 s
2. open for 0.5 s
3. blink (closed) for 0.5 s At a one hundred (100) ms sample rate, a twenty (20) sample blink template is given by blink_template=[1,1,1, 0,0,0,0,0, 1,1,1,1,1, 0,0,0,0,0, 1,1].

The blink mask is defined to mask out the samples just after a transition (0 to mask out or ignore samples), and is given by blink_mask=[1,1,1, 0,1,1,1,1, 0,1,1,1,1, 0,1,1,1,1, 0,1].

Optionally, a wider transition region may be masked out to allow for more timing uncertainty, and is given by blink_mask=[1,1,0, 0,1,1,1,0, 0,1,1,1,0, 0,1,1,1,0, 0,1].

Alternate patterns may be implemented, e.g. single long blink, in this case a 1.5 s blink with a 24-sample template, given by blink_template=[1,1,1,1,0,0, 0,0,0,0,0,0, 0,0,0,0,0,0, 0,1,1,1,1,1].

In an alternative embodiment, this blink_template is used without a blink_mask.

It is important to note that the above example is for illustrative purposes and does not represent a specific set of data.

Detection may be implemented by logically comparing the history of samples against the template and mask. The logical operation is to exclusive-OR (XOR) the template and the sample history sequence, on a bitwise basis, and then verify that all unmasked history bits match the template. For example, as illustrated in the blink mask samples above, in each place of the sequence of a blink mask that the value is logic 1, a blink has to match the blink mask template in that place of the sequence. However, in each place of the sequence of a blink mask that the value is logic 0, it is not necessary that a blink matches the blink mask template in that place of the sequence. For example, the following Boolean method equation, as coded in MATLAB® (MathWorks, Natick, Mass.), may be utilized.

matched=not(blink_mask)|not(xor(blink_template, test_sample)), wherein test_sample is the sample history. The matched value is a sequence with the same length as the blink template, sample history and blink_mask. If the matched sequence is all logic 1's, then a good match has occurred.

Breaking it down, not (xor (blink_template, test_sample)) gives a logic 0 for each mismatch and a logic 1 for each match. Logic oring with the inverted mask forces each location in the matched sequence to a logic 1 where the mask is a logic 0. Accordingly, the more places in a blink mask template where the value is specified as logic 0, the greater the margin of error in relation to a person's blinks is allowed. It is also important to note that the greater the number of logic 0's in the blink mask template, the greater the potential for false positive matched to expected or intended blink patterns. It should be appreciated that a variety of expected or intended blink patterns may be programmed into a device with one or more active at a time and in at least one embodiment control the use of particular blink patterns to be used in a particular operation state. More specifically, multiple expected or intended blink patterns may be utilized for the same purpose or functionality, or to implement different or alternate functionality. For example, one blink pattern may be utilized to cause the lens to change operation state between at least an asleep operation state and an awake operation state. The blink detection in at least one embodiment also can detect when the eyelids remain closed, which would be detected as a continuous blink; the eyelids have a movement trajectory to closing for sleep, which would be detected as a partial blink or series of partial blinks such as when a portion of the sensors are covered by an eyelid after a blink has occurred; and eyelid droop, which would be detected as a change in the steady state position of the upper and/or lower eyelid from its normal steady state position with or without confirmation of gaze position and/or head droop.

Figure 6:
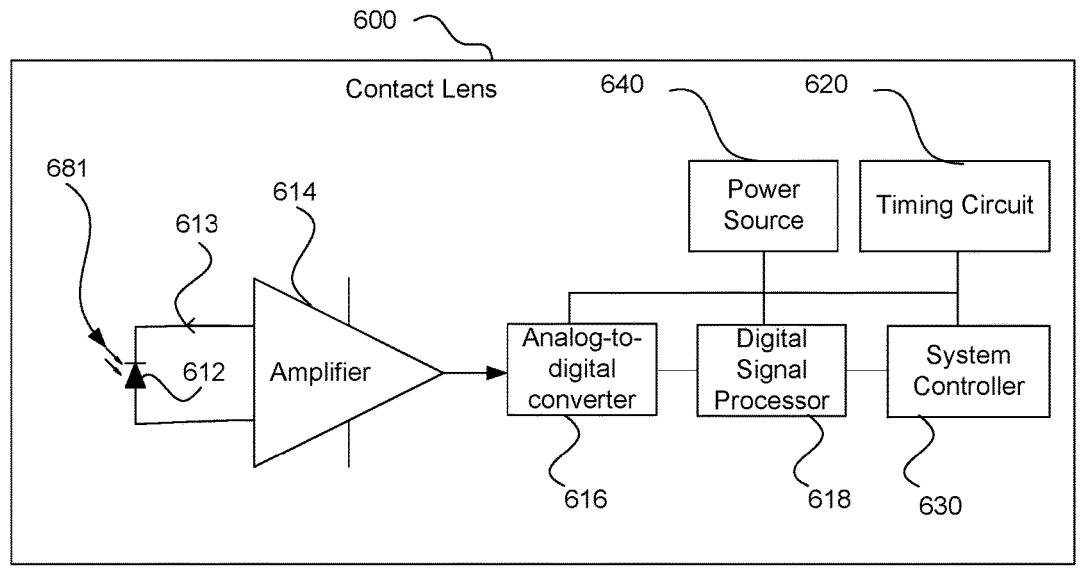
FIG. 6 illustrates a blink detection system in accordance with at least one embodiment of the present invention.

FIG. 6 illustrates, in block diagram form, a contact lens 600 having a photosensor 612, an amplifier 614, an analog-to-digital converter (or ADC) 616, a digital signal processor 618, a timing circuit 620, a system controller 630, and a power source 640. As discussed above, the components 612-618 may be also part of a communications circuit or alternatively the communications circuit is separate and includes an antenna and in further embodiments a transceiver. In a further alternative embodiment, the communications circuit includes both photosensor related components and wireless electrical signal communication components.

When the contact lens 600 is placed onto the front surface of a user's eye the electronic circuitry of the blink detector system may be utilized to implement the blink detection method according to at least one embodiment. The photosensor 612, as well as the other circuitry, is configured to detect blinks, various blink patterns produced by the user's eye, level of eyelid closure, and/or environmental light levels.

In this embodiment, the photosensor 612 may be embedded into the contact lens 600 and receives ambient light 681, converting incident photons into electrons and thereby causing a current, indicated by arrow 613, to flow into the amplifier 614. The photosensor or photodetector 612 may include any suitable device. In one embodiment, the photosensor 612 includes at least one photodiode. In at least one embodiment, the photodiode is implemented in a complimentary metal-oxide semiconductor (CMOS process technology) to increase integration ability and reduce the overall size of the photosensor 612 and the other circuitry. The current 613 is proportional to the incident light level and decreases substantially when the photodetector 612 is covered by an eyelid. The amplifier 614 creates an output proportional to the input, with gain, and may function as a transimpedance amplifier which converts input current into output voltage. The amplifier 614 may amplify a signal to a usable level for the remainder of the system, such as giving the signal enough voltage and power to be acquired by the ADC 616. For example, the amplifier may be necessary to drive subsequent blocks since the output of the photosensor 612 may be quite small and may be used in low-light environments. The amplifier 614 may be implemented as a variable-gain amplifier, the gain of which may be adjusted by the system controller 630, in a feedback arrangement, to maximize the dynamic range of the system. In addition to providing gain, the amplifier 614 may include other analog signal conditioning circuitry, such as filtering and other circuitry appropriate to the photosensor 612 and amplifier 614 outputs. The amplifier 614 may include any suitable device for amplifying and conditioning the signal output by the photosensor 612. For example, the amplifier 614 may have a single operational amplifier or a more complicated circuit comprising one or more operational amplifiers. As set forth above, the photosensor 612 and the amplifier 614 are configured to detect and isolate blink sequences based upon the incident light intensity received through the eye and convert the input current into a digital signal usable ultimately by the system controller 630. In at least one embodiment, the system controller 630 is preprogrammed or pre-configured to recognize various blink sequences, blink patterns, an/or light level changes in various light intensity level conditions and provide an appropriate output signal to the timing circuit 620. The system controller 630 in at least one embodiment also has associated memory.

In this embodiment, the ADC 616 may be used to convert a continuous, analog signal output from the amplifier 614 into a sampled, digital signal appropriate for further signal processing. For example, the ADC 616 may convert an analog signal output from the amplifier 614 into a digital signal that may be usable by subsequent or downstream circuits, such as a digital signal processing system or microprocessor 618. A digital signal processing system or digital signal processor 618 may be utilized for digital signal processing, including one or more of filtering, processing, detecting, and otherwise manipulating/processing sampled data to permit incident light detection for downstream use. The digital signal processor 618 may be preprogrammed with the blink sequences and/or blink patterns described above. The digital signal processor 618 also includes associated memory, which in at least one embodiment includes template and masks sets to detect, for example, blink patterns for each operation state as selected by the system controller 630. The digital signal processor 618 may be implemented utilizing analog circuitry, digital circuitry, software, or a combination thereof. In the illustrated embodiment, it is implemented in digital circuitry. The ADC 616 along with the associated amplifier 614 and digital signal processor 618 are activated at a suitable rate in agreement with the sampling rate previously described, for example every one hundred (100) ms, which is subject to adjustment in at least one embodiment.

A blink sequence in at least one embodiment may be utilized to change the operation state of the system and/or the system controller. In further embodiments, the system controller 630 may control other aspects of a powered contact lens depending on input from the digital signal processor 618, for example, changing the focus or refractive power of an electronically controlled lens through an actuator.

In at least one embodiment, the system controller 630 will determine the operation state of the lens based on a received blink pattern to set the operation state. Further to this embodiment, the operation state will determine a set of templates and masks to be used by the digital signal processor 618.

In at least one embodiment, the system controller 630 uses the signal from the photosensor chain; namely, the photosensor 612, the amplifier 614, the ADC 616 and the digital signal processing system 618, to compare sampled light levels to blink activation patterns.

Figure 7:
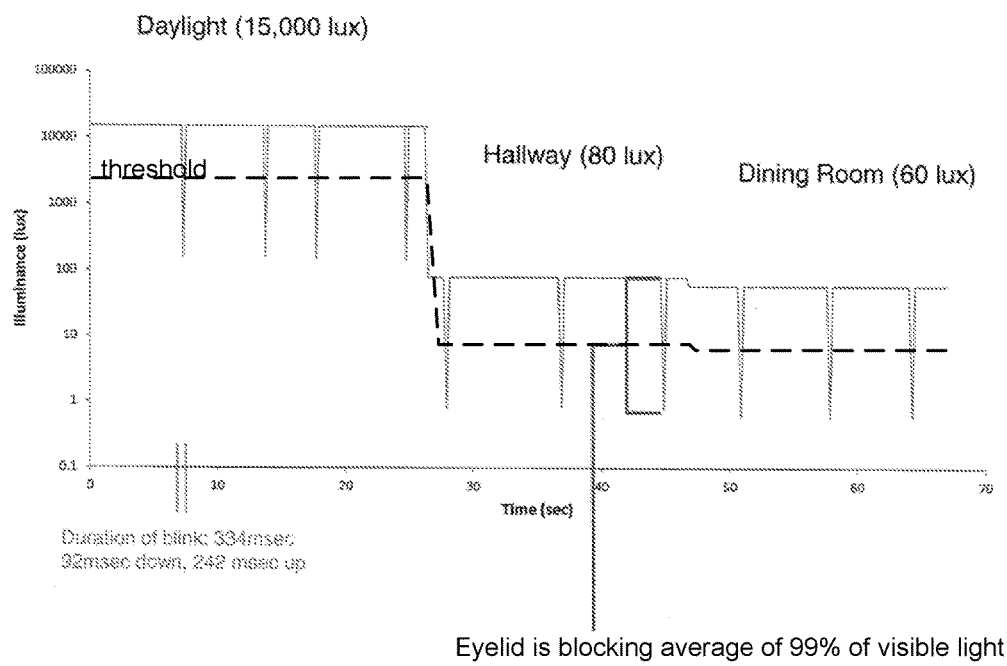
FIG. 7 illustrates a graphical representation of light incident on the surface of the eye versus time, illustrating a possible involuntary blink pattern recorded at various light intensity levels versus time and a usable threshold level based on some point between the maximum and minimum light intensity levels in accordance with at least one embodiment of the present invention.

Referring to FIG. 7, a graphical representation of blink pattern samples recorded at various light intensity levels versus time and a usable threshold level is illustrated. Accordingly, accounting for various factors may mitigate and/or prevent error in detecting blinks when sampling light incident on the eye, such as accounting for changes in light intensity levels in different places and/or while performing various activities. Additionally, when sampling light incident on the eye, accounting for the effects that changes in ambient light intensity may have on the eye and eyelid may also mitigate and/or prevent error in detecting blinks, such as how much visible light an eyelid blocks when it is closed in low-intensity light levels and in high-intensity light levels. In other words, in order to prevent erroneous blinking patterns from being utilized to control, the level of ambient light in at least one embodiment is accounted for as is explained in greater detail below.

For example, in a study, it has been found that the eyelid on average blocks approximately ninety-nine (99) percent of visible light, but at lower wavelengths less light tends to be transmitted through the eyelid, blocking out approximately 99.6 percent of visible light. At longer wavelengths, toward the infrared portion of the spectrum, the eyelid may block only thirty (30) percent of the incident light. What is important to note, however, is that light at different frequencies, wavelengths and intensities may be transmitted through the eyelids with different efficiencies. For example, when looking at a bright light source, an individual may see red light with his or her eyelids closed. There may also be variations in how much visible light an eyelid blocks based upon an individual, such as an individual's skin pigmentation. As is illustrated in FIG. 7, data samples of blink patterns across various lighting levels are simulated over the course of a seventy (70) second time interval wherein the visible light intensity levels transmitted through the eye are recorded during the course of the simulation, and a usable threshold value is illustrated. The threshold is set at a value in between the peak-to-peak value of the visible light intensity recorded for the sample blink patterns over the course of the simulation at varying light intensity levels. Having the ability to preprogram blink patterns while tracking an average light level over time and adjusting a threshold may be critical to being able to detect when an individual is blinking, as opposed to when an individual is not blinking and/or there is just a change in light intensity level in a certain area.

Referring now again to FIG. 6, in further alternate embodiments, the system controller 630 may receive input from sources including one or more of a blink detector, pressure sensors, an accelerometer(s), photosensors, and a fob control. For example, an electronic or powered contact lens may be programmable specific to an individual user, such as programming a lens to recognize both of an individual's blink patterns.

FIGS. 8-18B provide examples of eyelid position sensor systems, which in at least one embodiment are used to detect environmental light levels.

Figure 8:
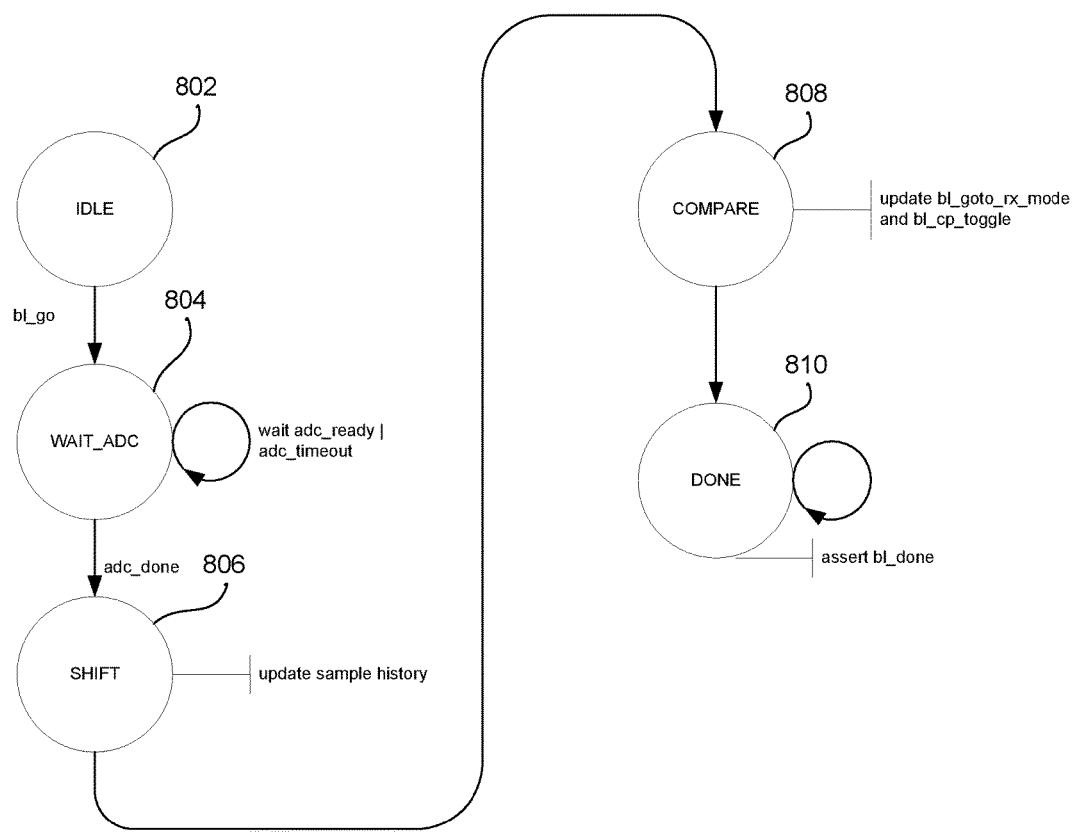
FIG. 8 illustrates a state transition diagram of a blink detection system in accordance with at least one embodiment of the present invention.

FIG. 8 illustrates a state transition diagram for a blink detection system in accordance with the blink detection method. The system starts in an IDLE state 802 waiting for an enable signal bl_go to be asserted. When the enable bl_go signal is asserted, for example, by an oscillator and control circuit which pulses bl_go at a one hundred (100) ms rate commensurate with the blink sampling rate, the state machine then transitions to a WAIT_ADC state 804 in which an ADC is enabled to convert a received light level to a digital value. The ADC asserts an adc_done signal to indicate its operations are complete, and the system or state machine transitions to a SHIFT state 806. In the SHIFT state 806 the system pushes the most recently received ADC output value onto a shift register to hold the history of blink samples. In some embodiments, the ADC output value is first compared to a threshold value to provide a single bit (1 or 0) for the sample value, in order to minimize storage requirements. The system or state machine then transitions to a COMPARE state 808 in which the values in the sample history shift register are compared to one or more blink sequence templates and masks as described above. If a match is detected, one or more output signals may be asserted, such as one to switch the state of the lens. The system or state machine then transitions to the DONE state 810 and asserts a bl_done signal to indicate its operations are complete.

Figure 9:
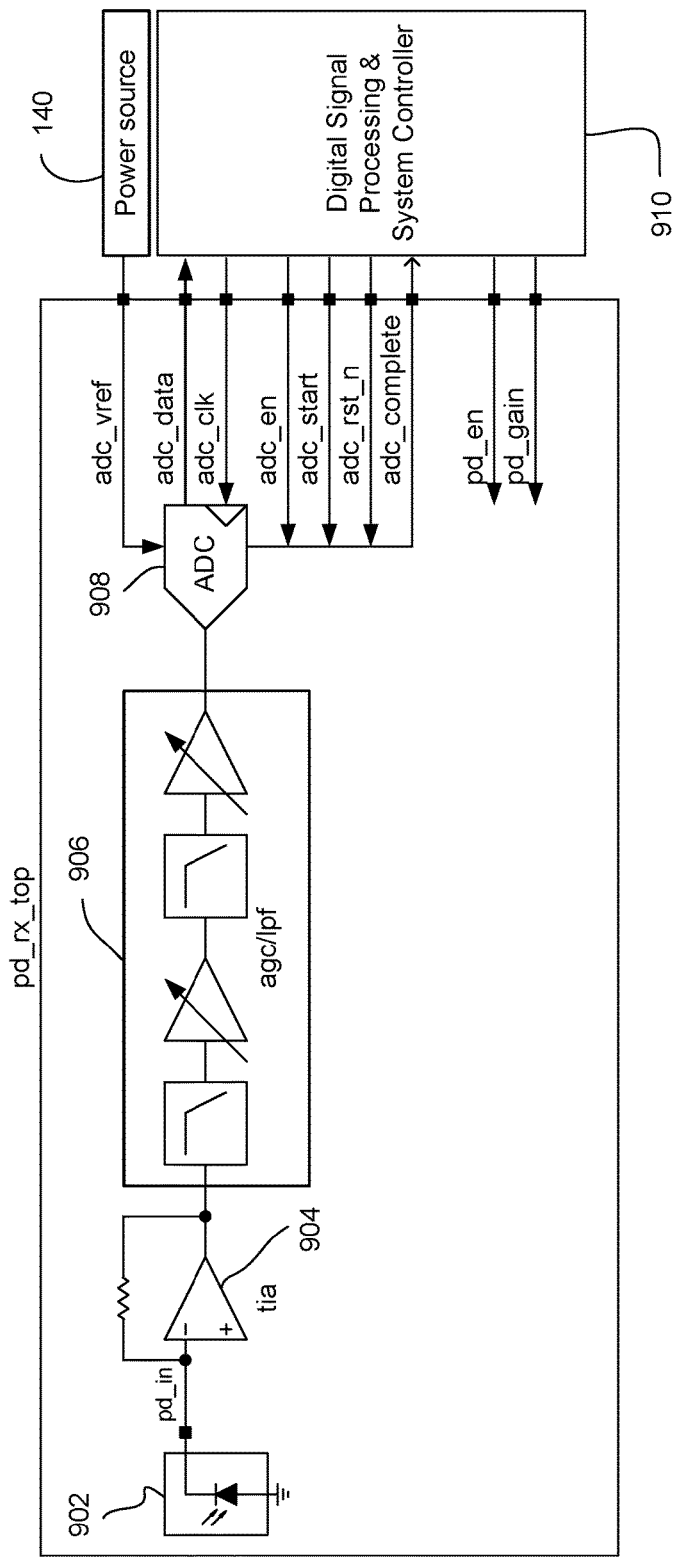
FIG. 9 illustrates a diagrammatic representation of a photodetection path utilized to detect and sample received light signals in accordance with at least one embodiment of the present invention.

FIG. 9 illustrates a photosensor or photodetector signal path pd_rx_top that may be used to detect and sample received light levels. The signal path pd_rx_top may include a photodiode 902, a transimpedance amplifier 904, an automatic gain and low pass filtering stage 906 (AGC/LPF), and an ADC 908. The adc_vref signal is input to the ADC 908 from the power source 140 (see, e.g., FIG. 1A) or alternately it may be provided from a dedicated circuit inside the analog-to-digital converter 908. The output from the ADC 908, adc_data, is transmitted to the digital signal processing and system controller block 618/630 (see FIG. 6). Although illustrated in FIG. 6 as individual blocks 618 and 630, for ease of explanation, the digital signal processing and system controller are preferably implemented on a single block 910. The enable signal, adc_en, the start signal, adc_start, and the reset signal, adc_rst_n are received from the digital signal processing and system controller 910 while the complete signal, adc_complete, is transmitted thereto. The clock signal, adc_clk, may be received from a clock source external to the signal path, pd_rx_top, or from the digital signal processing and system controller 910. It is important to note that the adc_clk signal and the system clock may be running at different frequencies. It is also important to note that any number of different ADCs may be utilized in accordance with the present invention which may have different interface and control signals but which perform a similar function of providing a sampled, digital representation of the output of the analog portion of the photosensor signal path. The photodetect enable, pd_en, and the photodetect gain, pd_gain, are received from the digital signal processing and system controller 910.

Figure 10:
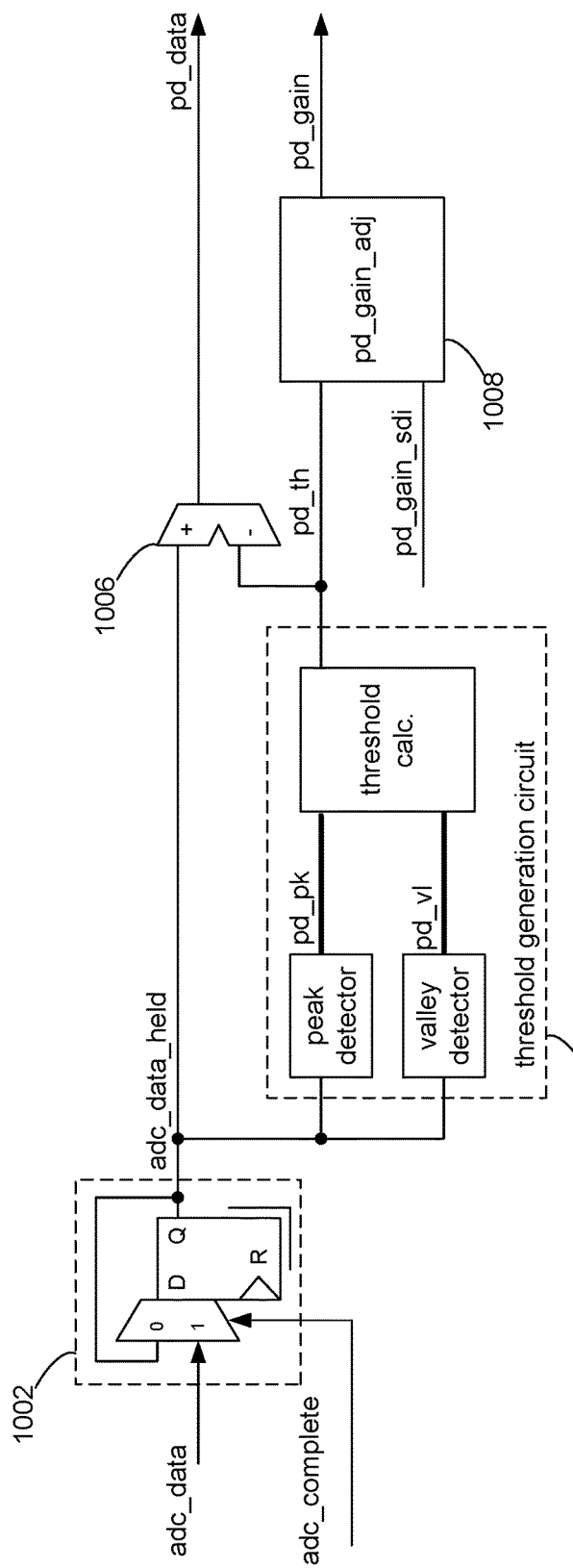
FIG. 10 illustrates a block diagram of digital conditioning logic in accordance with at least one embodiment of the present invention.

FIG. 10 illustrates a block diagram of digital conditioning logic 1000 that may be used to reduce the received ADC signal value, adc_data, to a single bit value pd_data. The digital conditioning logic 1000 may include a digital register 1002 to receive the data, adc_data, from the photodetection signal path pd_rx_top to provide a held value on the signal adc_data_held. The digital register 1002 is configured to accept a new value on the adc_data signal when the adc_complete signal is asserted and to otherwise hold the last accepted value when the adc_complete signal is received. In this manner the system may disable the photodetection signal path once the data is latched to reduce system current consumption. The held data value may then be averaged, for example, by an integrate-and-dump average or other averaging methods implemented in digital logic, in the threshold generation circuit 1004 to produce one or more thresholds on the signal pd_th. The held data value may then be compared, via comparator 1006, to the one or more thresholds to produce a one-bit data value on the signal pd_data. It will be appreciated that the comparison operation may employ hysteresis or comparison to one or more thresholds to minimize noise on the output signal pd_data. The digital conditioning logic may further include a gain adjustment block pd_gain_adj 1008 to set the gain of the automatic gain and low-pass filtering stage 906 in the photodetection signal path via the signal pd_gain, illustrated in FIG. 9, according to the calculated threshold values and/or according to the held data value. It is important to note that in this embodiment six bit words provide sufficient resolution over the dynamic range for blink detection while minimizing complexity. FIG. 10 illustrates an alternative embodiment that includes providing a pd_gain_sdi control signal from, for example, the serial data interface that allows one to override the automatic gain control determined by gain adjustment block pd_gain_adj 1008.

In one embodiment, the threshold generation circuit 1004 includes a peak detector, a valley detector and a threshold calculation circuit. In this embodiment, the threshold and gain control values may be generated as follows. The peak detector and the valley detector are configured to receive the held value on signal adc_data_held. The peak detector is further configured to provide an output value, pd_pk, which quickly tracks increases in the adc_data_held value and slowly decays if the adc_data_held value decreases. The operation is analogous to that of a classic diode envelope detector, as is well-known in the electrical arts. The valley detector is further configured to provide an output value pd_vl which quickly tracks decreases in the adc_data_held value and slowly decays to a higher value if the adc_data_held value increases. The operation of the valley detector is also analogous to a diode envelope detector, with the discharge resistor tied to a positive power supply voltage. The threshold calculation circuit is configured to receive the pd_pl and pd_vl values and is further configured to calculate a mid-point threshold value pd_th_mid based on an average of the pd_pk and pd_vl values. The threshold generation circuit 1004 provides the threshold value pd_th based on the mid-point threshold value pd_th_mid.

The threshold generation circuit 1004 may be further adapted to update the values of the pd_pk and pd_vl levels in response to changes in the pd_gain value. If the pd_gain value increases by one step, then the pd_pk and pd_vl values are increased by a factor equal to the expected gain increase in the photodetection signal path. If the pd_gain value decreases by one step, then the pd_pk and pd_val values are decreased by a factor equal to the expected gain decrease in the photodetection signal path. In this manner the states of the peak detector and valley detectors, as held in the pd_pk and pd_vl values, respectively, and the threshold value pd_th as calculated from the pd_pk and pd_vl values are updated to match the changes in signal path gain, thereby avoiding discontinuities or other changes in state or value resulting only from the intentional change in the photodetection signal path gain.

In a further embodiment of the threshold generation circuit 1004, the threshold calculation circuit may be further configured to calculate a threshold value pd_th_pk based on a proportion or percentage of the pd_pk value. In at least one embodiment the pd_th_pk may be advantageously configured to be seven eighths of the pd_pk value, a calculation which may be implemented with a simple right shift by three bits and a subtraction as is well-known in the relevant art. The threshold calculation circuit may select the threshold value pd_th to be the lesser of pd_th_mid and pd_th_pk. In this manner, the pd_th value will never be equal to the pd_pk value, even after long periods of constant light incident on the photodiode which may result in the pd_pk and pd_vl values being equal. It will be appreciated that the pd_th_pk value ensures detection of a blink after long intervals. The behavior of the threshold generation circuit is further illustrated in FIG. 14, as discussed subsequently.

Figure 11:
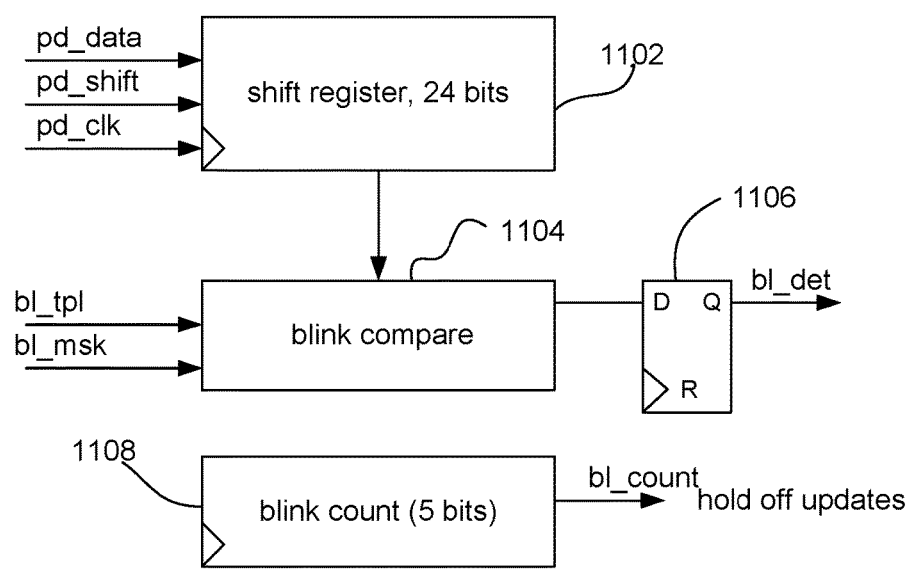
FIG. 11 illustrates a block diagram of digital detection logic in accordance with at least one embodiment of the present invention.

FIG. 11 illustrates a block diagram of digital detection logic 1100 that may be used to implement a digital blink detection method. The digital detection logic 1100 may include a shift register 1102 adapted to receive the data from the photodetection signal path pd_rx_top, FIG. 9, or from the digital conditioning logic, FIG. 10, as illustrated here on the signal pd_data, which has a one bit value. The shift register 1102 holds a history of the received sample values, here in a 24-bit register. The digital detection logic 1100 further includes a comparison block 1104, adapted to receive the sample history and one or more blink templates bl_tpl and blink masks bl_mask based on operation state (if necessary), and is configured to indicate a match to the one or more templates and masks on one or more output signals that may be held for later use. In at least one embodiment, the operation state determines the set of templates bl_tpl and blink masks bl_mask to be used by the comparison block 1104.

The output of the comparison block 1104 is latched via a D flip-flop 1106. The digital detection logic 1100 may further include a counter 1108 or other logic to suppress successive comparisons that may be on the same sample history set at small shifts due to the masking operations. In a preferred embodiment the sample history is cleared or reset after a positive match is found, thus requiring a full, new matching blink sequence to be sampled before being able to identify a subsequent match. The digital detection logic 1100 may still further include a state machine or similar control circuitry to provide the control signals to the photodetection signal path and the ADC. In some embodiments the control signals may be generated by a control state machine that is separate from the digital detection logic 1100. This control state machine may be part of the digital signal processing and system controller 910 (see FIG. 9).

Figure 12:
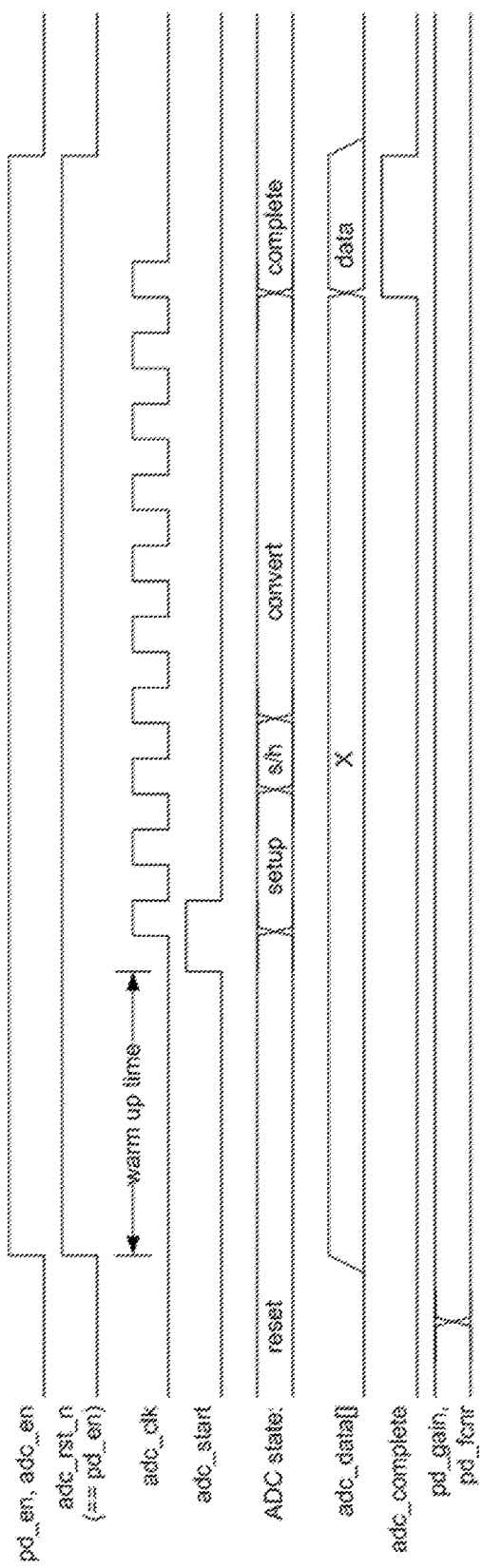
FIG. 12 illustrates a timing diagram in accordance with at least one embodiment of the present invention.

FIG. 12 illustrates a timing diagram of the control signals provided from a blink detection subsystem to an ADC 908 (FIG. 9) used in a photodetection signal path. The enable and clock signals adc_en, adc_rst_n and adc_clk are activated at the start of a sample sequence and continue until the analog-to-digital conversion process is complete. In one embodiment the ADC conversion process is started when a pulse is provided on the adc_start signal. The ADC output value is held in an adc_data signal and completion of the process is indicated by the analog-to-digital converter logic on an adc_complete signal. Also illustrated in FIG. 12 is the pd_gain signal which is utilized to set the gain of the amplifiers before the ADC. This signal is shown as being set before the warm-up time to allow the analog circuit bias and signal levels to stabilize prior to conversion.

Figure 13:
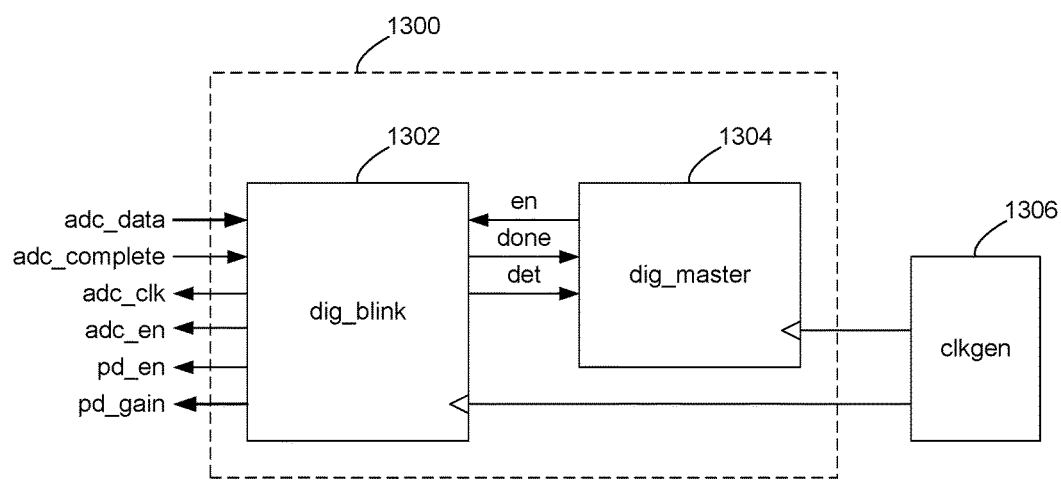
FIG. 13 illustrates a diagrammatic representation of a digital system controller in accordance with at least one embodiment of the present invention.

FIG. 13 illustrates a digital system controller 1300 having a digital blink detection subsystem dig_blink 1302. The digital blink detection subsystem dig_blink 1302 may be controlled by a master state machine dig_master 1304 and may be adapted to receive clock signals from a clock generator clkgen 1306 external to the digital system controller 1300. The digital blink detection subsystem dig_blink 1302 may be adapted to provide control signals to and receive signals from a photodetection subsystem as described above. The digital blink detection subsystem dig_blink 1302 may include digital conditioning logic and digital detection logic as described above, in addition to a state machine to control the sequence of operations in a blink detection method. The digital blink detection subsystem dig_blink 1302 may be adapted to receive an enable signal from the master state machine 1304 and to provide a completion or done indication and a blink detection indication back to the master state machine 1304.

In an alternative embodiment to the embodiment illustrated in FIG. 13, a time clock is connected to the clock generator 1306 to track time since the lens began operation and provide a time stamp signal to any data logging components. The time clock and the clock generator 1306 are an example of a timing circuit.

Figure 14A:
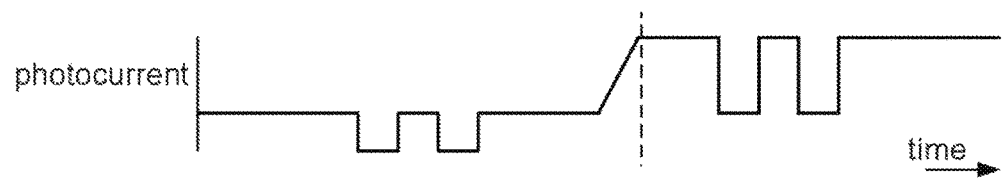
FIGS. 14A through 14G illustrate timing diagrams for automatic gain control in accordance with at least one embodiment of the present invention.
Figure 14B:
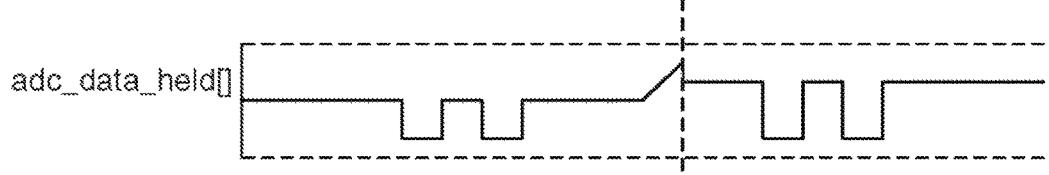
Figure 14C:
Figure 14D:
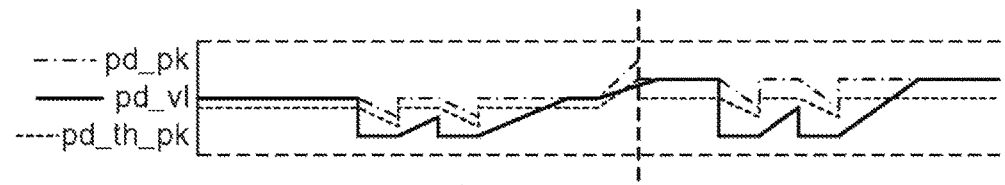
Figure 14E:
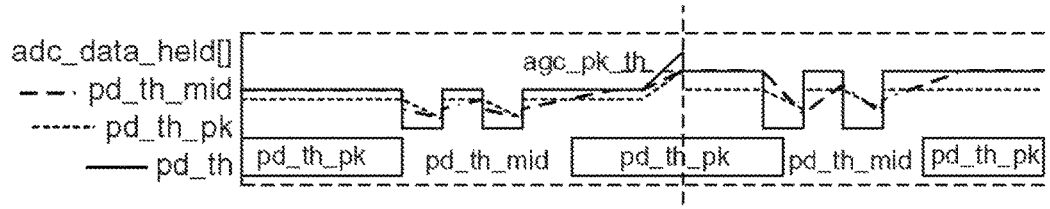
Figure 14F:
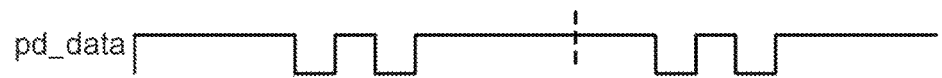
Figure 14G:

FIGS. 14A-14G provide waveforms to illustrate the operation of the threshold generation circuit and automatic gain control (FIG. 10). FIG. 14A illustrates an example of photocurrent versus time as might be provided by a photodiode in response to varying light levels. In the first portion of the plot, the light level and resulting photocurrent are relatively low compared to in the second portion of the plot. In both the first and second portions of the plot a double blink is seen to reduce the light and photocurrent. Note that the attenuation of light by the eyelid may not be one hundred (100) percent, but a lower value depending on the transmission properties of the eyelid for the wavelengths of light incident on the eye. FIG. 14B illustrates the adc_data_held value that is captured in response to the photocurrent waveform of FIG. 14A. For simplicity, the adc_data_held value is illustrated as a continuous analog signal rather than a series of discrete digital samples. It will be appreciated that the digital sample values will correspond to the level illustrated in FIG. 14B at the corresponding sample times. The dashed lines at the top and bottom of the plot indicate the maximum and minimum values of the adc_data and adc_data_held signals. The range of values between the minimum and maximum is also known as the dynamic range of the adc_data signal. As discussed below, the photodection signal path gain is different (lower) in the second portion of the plot. In general the adc_data_held value is directly proportional to the photocurrent, and the gain changes only affect the ration or the constant of proportionality. FIG. 14C illustrates the pd_pk, pd_vl and pd_th_mid values calculated in response to the adc_data_held value by the threshold generation circuit. FIG. 14D illustrates the pd_pk, pd_vl and pd_values calculated in response to the adc_data_held value in some embodiments of the threshold generation circuit. Note that the pd_th_pk value is always some proportion of the pd_pk value. FIG. 14E illustrates the adc_data_held value with the pd_th_mid and pd_th_pk values. Note that during long periods of time where the adc_data_held value is relatively constant the pd_th_mid value becomes equal to the adc_data_held value as the pd_vl value decays to the same level. The pd_th_pk value always remains some amount below the adc_data_held value. Also illustrated in FIG. 14E is the selection of pd_th where the pd_th value is selected to be the lower of pd_th_pk and pd_th_mid. In this way the threshold is always set some distance away from the pd_pk value, avoiding false transitions on pd_data due to noise on the photocurrent and adc_data_held signals. FIG. 14F illustrates the pd_data value generated by comparison of the adc_data_held value to the pd_th value. Note that the pd_data signal is a two-valued signal which is low when a blink is occurring. FIG. 14G illustrates a value of tia_gain versus time for these example waveforms. The value of tia_gain is set lower when the pd_th starts to exceed a high threshold shown as agc_pk th in FIG. 14E. It will be appreciated that similar behavior occurs for raising tia_gain when pd_th starts to fall below a low threshold. Looking again at the second portion of each of the FIGS. 14A through 14E the effect of the lower tia_gain is clear. In particular note that the adc_data_held value is maintained near the middle of the dynamic range of the adc_data and adc_data_held signals. Further, it is important to note that the pd_pk and pd_vl values are updated in accordance with the gain change as described above such that discontinuities are avoided in the peak and valley detector states and values due solely to changes in the photodetection signal path gain.

Figure 15:
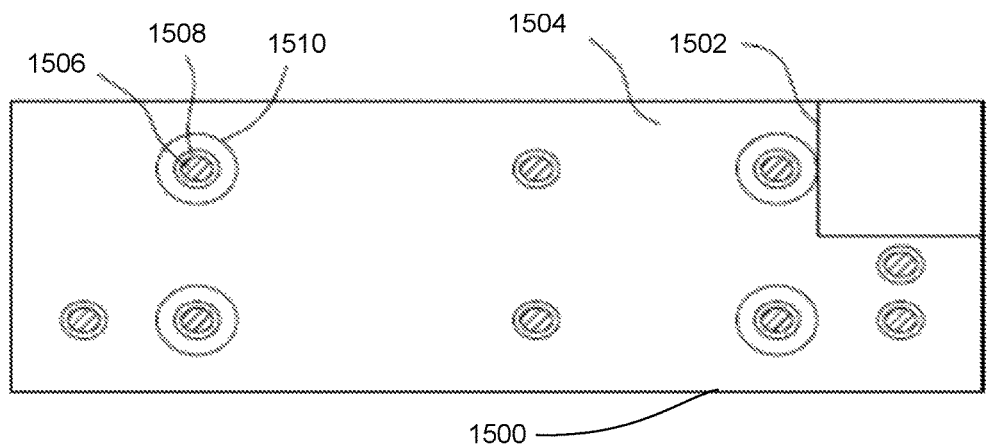
FIG. 15 illustrates a diagrammatic representation of light-blocking and light-passing regions on an integrated circuit die in accordance with at least one embodiment of the present invention.

FIG. 15 illustrates light-blocking and light-passing features on an integrated circuit die 1500. The integrated circuit die 1500 includes a light passing region 1502, a light blocking region 1504, bond pads 1506, passivation openings 1508, and light blocking layer openings 1510. The light-passing region 1502 is located above the photosensors (not illustrated), for example an array of photodiodes implemented in the semiconductor process. In at least one embodiment, the light-passing region 1502 permits as much light as possible to reach the photosensors thereby maximizing sensitivity. This may be done through removing polysilicon, metal, oxide, nitride, polyimide, and other layers above the photoreceptors, as permitted in the semiconductor process utilized for fabrication or in post-processing. The light-passing area 1502 may also receive other special processing to optimize light detection, for example an anti-reflective coating, filter, and/or diffuser. The light-blocking region 1504 may cover other circuitry on the die which does not require light exposure. The performance of the other circuitry may be degraded by photocurrents, for example shifting bias voltages and oscillator frequencies in the ultra-low current circuits required for incorporation into contact lenses, as mentioned previously. The light-blocking region 1504 is preferentially formed with a thin, opaque, reflective material, for example aluminum or copper already used in semiconductor wafer processing and post-processing. If implemented with metal, the material forming the light-blocking region 1504 must be insulated from the circuits underneath and the bond pads 1506 to prevent short-circuit conditions. Such insulation may be provided by the passivation already present on the die as part of normal wafer passivation, e.g. oxide, nitride, and/or polyimide, or with other dielectric added during post-processing. Masking permits light blocking layer openings 1510 so that conductive light-blocking metal does not overlap bond pads on the die. The light-blocking region 1504 is covered with additional dielectric or passivation to protect the die and avoid short-circuits during die attachment. This final passivation has passivation openings 1508 to permit connection to the bond pads 1506.

Figure 16:
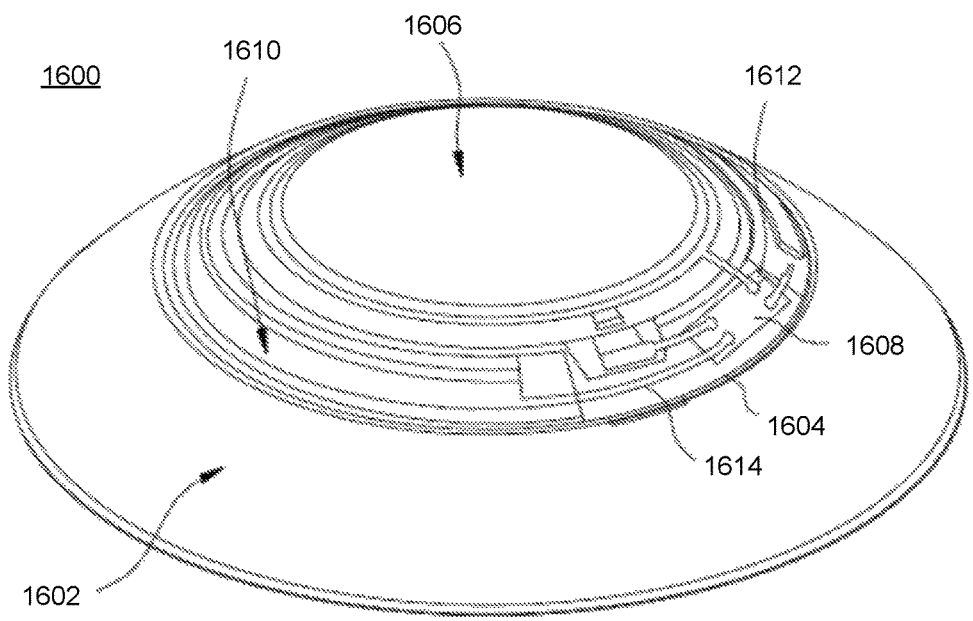
FIG. 16 illustrates a diagrammatic representation of an electronic insert, including a blink detector, for a powered contact lens in accordance with at least one embodiment of the present invention.

FIG. 16 illustrates a contact lens with an electronic insert having a blink detection system. The contact lens 1600 includes a soft plastic portion 1602 which has an electronic insert 1604. This insert 1604 includes a lens 1606 which is activated by the electronics, for example focusing near or far depending on activation. Integrated circuit 1608 mounts onto the insert 1604 and connects to batteries 1610, lens 1606, and other components as necessary for the system. In at least one embodiment, the integrated circuit 1608 includes a photosensor 1612 and associated photodetector signal path circuits. The photosensor 1612 faces outward through the lens insert and away from the eye, and is thus able to receive ambient light. The photosensor 1612 may be implemented on the integrated circuit 1608 (as shown) for example as a single photodiode or array of photodiodes. The photosensor 1612 may also be implemented as a separate device mounted on the insert 1604 and connected with wiring traces 1614. When the eyelid closes, the lens insert 1604 including photodetector 1612 is covered, thereby reducing the light level incident on the photodetector 1612. The photodetector 1612 is able to measure the ambient light to determine if the user is blinking or not. Based on this disclosure one of ordinary skill in the art should appreciate that photodetector 1612 may be replaced or augmented by the other sensors discussed in this disclosure.

Additional embodiments of blink detection may allow for more variation in the duration and spacing of the blink sequence, for example by timing the start of a second blink based on the measured ending time of a first blink rather than by using a fixed template or by widening the mask "don't care" intervals (0 values).

It will be appreciated that blink detection and/or clock frequency adjustment may be implemented in digital logic or in software running on a microcontroller. The method logic or microcontroller may be implemented in a single application-specific integrated circuit (ASIC) with photodetection signal path circuitry and a system controller, or it may be partitioned across more than one integrated circuit.

In accordance with another embodiment, a powered or electronic ophthalmic lens may incorporate an eyelid or lid position sensor. It is known that the eyelids protect the globe in a number of ways, including the blink reflex and the tear spreading action. The blink reflex of the eyelids prevents trauma to the globe by rapidly closing upon a perceived threat to the eye. Blinking also spreads tears over the globe's surface to keep it moist and rinse away bacteria and other foreign matter. But the movement of the eyelids may also indicate other actions or functions at play beyond being used to receive instructions from an individual (or wearer) wearing an electronic ophthalmic lens. It is also important to note that the sensed data, in addition to or in alternate use may simply be utilized as part of a collection process rather than as a triggering event. For example, the sensed data may be collected, logged and utilized in treating medical conditions or recording amount of sleep. In other words, it should also be appreciated that a device utilizing such a sensor may not change state in a manner visible to the user; rather the device may simply log data. For example, such a sensor could be used to determine if a user has fallen asleep during a work shift.

Figure 17A:
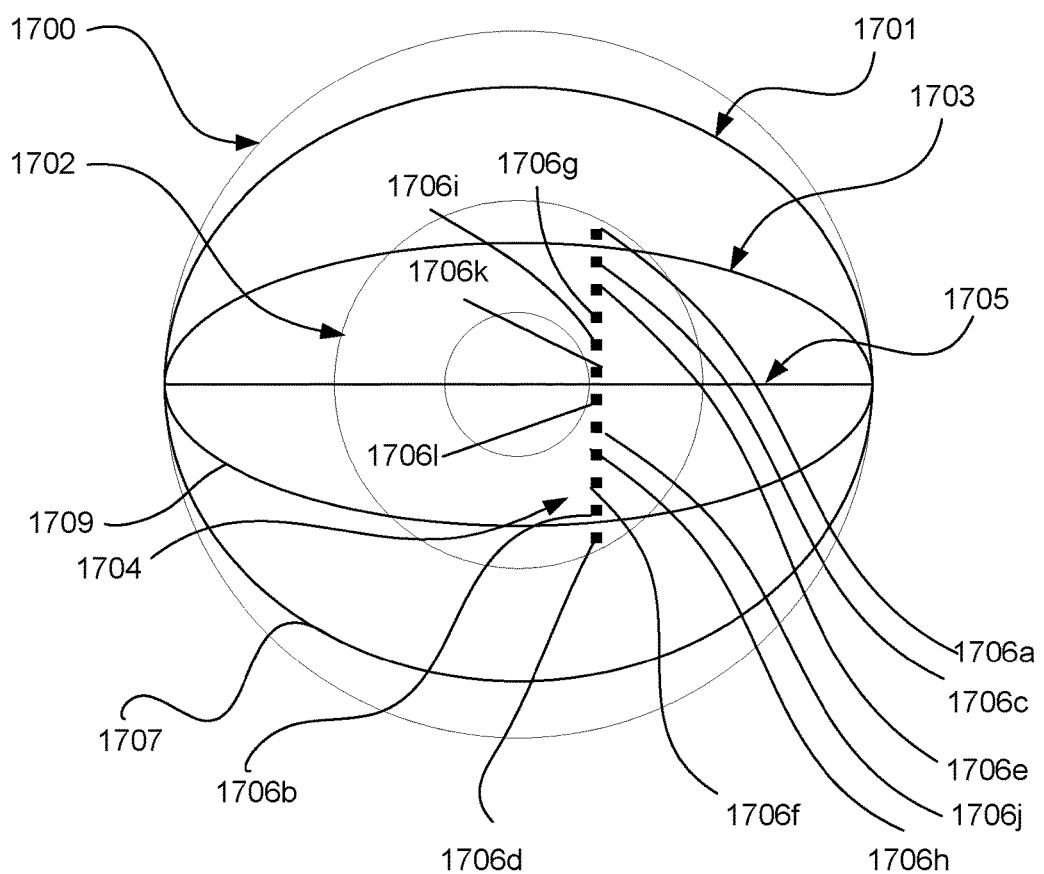
FIGS. 17A and 17B illustrate diagrammatic representations of eyelid position sensors in accordance with at least one embodiment of the present invention.
Figure 17B:
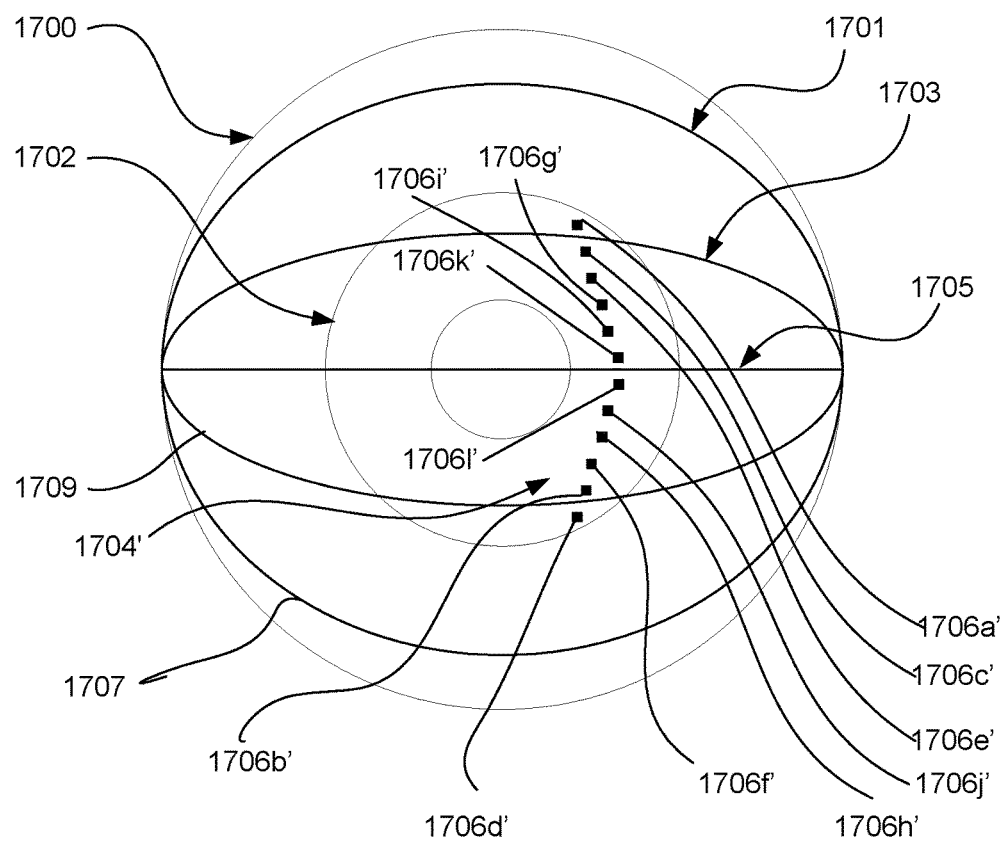

Referring now to FIG. 17A, there is illustrated a lid position sensor system on an eye 1700. The system is incorporated into a contact lens 1702. The top and bottom eyelids are shown, with the top lid having possible locations 1701, 1703, and 1705 in order of increasing closure. The bottom eyelid is also illustrated with levels of closure corresponding to the top lid; namely, locations 1707, 1709 and 1705. When the eyelids are closed, they occupy the same position; namely, 1705. The contact lens 1702 in accordance with the embodiment includes a sensor array 1704. This sensor array 1704 includes one or more photosensors. In this embodiment, the sensor array 1704 includes twelve (12) photosensors 1706a-1706l. With the top lid at position 1701 and the bottom lid at position 1707, all photosensors 1706a-1706l are exposed and receive ambient light, thereby creating a photocurrent which may be detected by an electronic circuit described herein. With the lids partially closed at positions 1703 and 1709, the top and bottom photosensors 1706a and 1706b are covered, receive less light than the other photosensors 1706c-1706l, and output a correspondingly lower current which may be detected by the electronic circuit. With the lids totally closed in position 1705, all sensors 1706a-1706l are covered with a corresponding reduction in current. This system may be used to detect lid position by sampling each photosensor in the sensor array and using the photocurrent output versus sensor position to determine lid position, for example, if the upper and lower eyelids do not fully open after blinks indicating, for example squinting or potential onset of sleep or fatigue. It will be appreciated that the photosensors should be placed in suitable locations on the contact lens, for example providing enough sample locations to reliably determine lid position while not obstructing the clear optic zone (roughly the area occupied by a dilated pupil.) This system may also be used to detect blinks by routinely sampling the sensors and comparing measurements over time. In an alternative embodiment, photosensors 1706a'-1706l' of a sensor array 1704' form an arcuate pattern around the pupil while being vertically spaced from each other as illustrated, for example, in FIG. 17B. Under either of the illustrated embodiment, one of ordinary skill in the art should appreciate that a number other than 12 may be used in the sensor array. Further examples include a number in a range of 3 through 15 (including the end points in at least one embodiment), and more particularly a number in a range of 4 through 8 (including the end points in at least one embodiment).

Figure 18A:
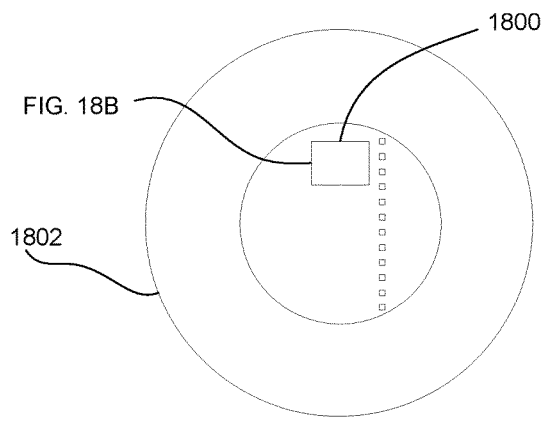
FIG. 18A illustrates a diagrammatic representation of an electronic system incorporated into a contact lens for detecting eyelid position in accordance with at least one embodiment of the present invention.
Figure 18B:
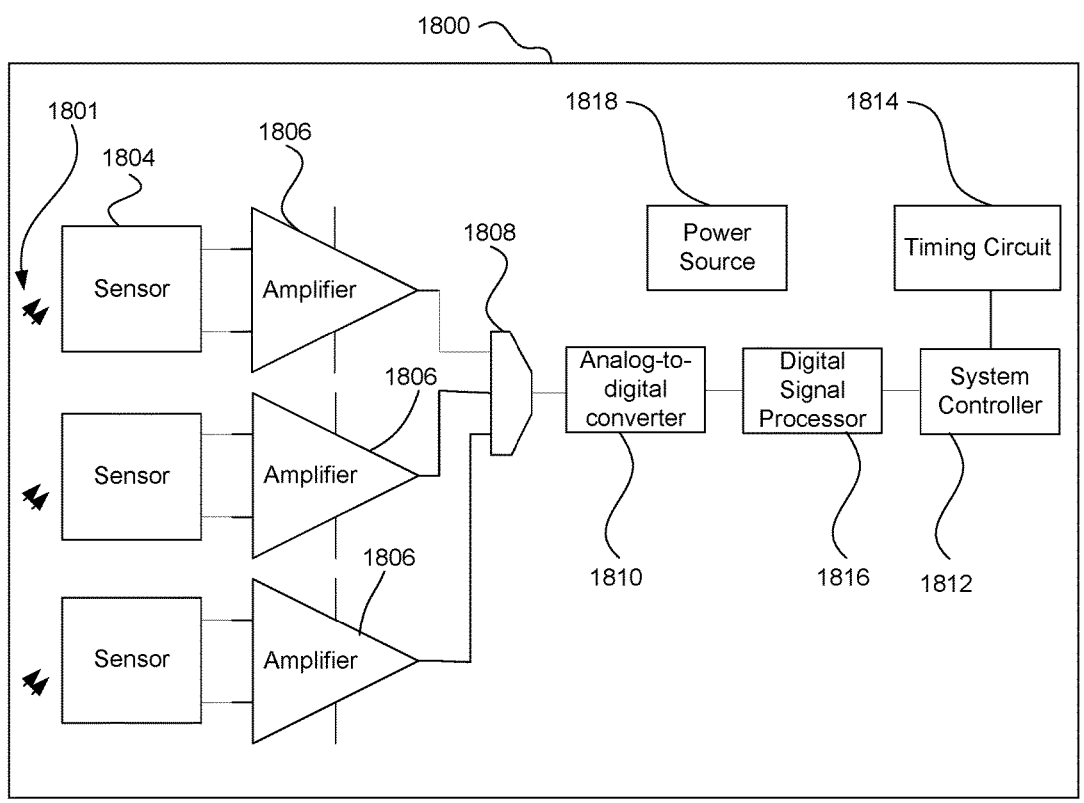
FIG. 18B illustrates an enlarged view of the electronic system of FIG. 18A.

FIGS. 18A and 18B illustrate an electronic system 1800 in which lid position photosensors, as set forth above, are used to trigger activity in a contact lens 1802 or more specifically, a powered or electronic ophthalmic lens. FIG. 18A shows the electronic system 1800 on the lens 1802, and FIG. 18B is an exploded view of the system 1800. Light 1801 is incident onto one or more photosensors 1804 as previously described with respect to FIGS. 16A and 16B. These photosensors 1804 may be implemented with photodiodes, cadmium sulfide (CdS) sensors, or other technologies suitable for converting ambient light into current. Depending on the choice of photosensors 1804, amplifiers 1806 or other suitable circuitry may be required to condition the input signals for use by subsequent or downstream circuits. A multiplexer 1808 permits a single analog-to-digital converter (or ADC) 1810 to accept inputs from multiple photosensors 1804. The multiplexer 1808 may be placed immediately after the photosensors 1804, before the amplifiers 1806, or may not be used depending on considerations for current consumption, die size, and design complexity. Since multiple photosensors 1804 are needed at various positions on the eye to detect lid position, sharing downstream processing components (for example amplifiers, an analog-to-digital converter, and digital signed processors) may significantly reduce the size needed for the electronic circuitry. The amplifiers 1806 create an output proportional to the input, with gain, and may function as transimpedance amplifiers which convert input current into output voltage. The amplifiers 1806 may amplify a signal to a usable level for the remainder of the system, such as giving the signal enough voltage and power to be acquired by the ADC 1810. For example, the amplifiers 1806 may be necessary to drive subsequent blocks since the output of the photosensors 1804 may be quite small and may be used in low-light environments. Amplifiers 1806 may also be implemented as variable-gain amplifiers, the gain of which may be adjusted by a system controller 1812 to maximize the dynamic range of the system 1800. In addition to providing gain, the amplifiers 1806 may include other analog signal conditioning circuitry, such as filtering and other circuitry appropriate to the photosensor 1804 and amplifier 1806 output. The amplifiers 1806 may be any suitable device for amplifying and conditioning the signal output by the photosensor 1804. For example, the amplifiers 1806 may be a single operational amplifier or a more complicated circuit comprising one or more operational amplifiers.

As set forth above, the photosensors 1804 and the amplifiers 1806 are configured to detect incident light 1801 at various positions on the eye and convert the input current into a digital signal usable ultimately by the system controller 1812. In at least one embodiment, the system controller 1812 is preprogrammed to sample each photosensor 1804 on the eye to frequency of a reference light and provide an appropriate output signal to a timing circuit 1814. In at least one embodiment, the system controller 1812 also includes associated memory. The system controller 1812 may combine recent samples of the photosensors 1804 to preprogrammed patterns correlating to lid open and squinting positions. Recording a user's eyelid patterns under various ambient light and focal distance situations may be required to program the system controller 1812 for reliable detection. The system 1800 may need to differentiate between eyelid position changes, normal changes in ambient light, shadows, and other phenomena. This differentiation may be accomplished through proper selection of the sampling frequency, amplifier gain, and other system parameters, optimization of sensors placement in the contact lens, determination of lid position patterns, recording ambient light, comparing each photosensor to adjacent and all photosensors, and other techniques to discern lid position uniquely.

In at least one embodiment, the ADC 1810 may be used to convert a continuous, analog signal output from the amplifiers 1806 through the multiplexer into a sampled, digital signal appropriate for further signal processing. For example, the ADC 1810 may convert an analog signal output from the amplifiers 1806 into a digital signal that may be useable by subsequent or downstream circuits, such as a digital signal processing system or microprocessor 1816. A digital signal processing system or digital signal processor 1816 may be utilized for digital signal processing, including one or more of filtering, processing, detecting, and otherwise manipulating/processing sampled data to permit incident light detection for downstream use. The digital signal processor 1816 may be preprogrammed with various lid patterns. The digital signal processor 1816 also includes associated memory in at least one embodiment. The digital signal processor 1816 may be implemented utilizing analog circuitry, digital circuitry, software, and/or preferably a combination thereof. The ADC 1810 along with the associated amplifiers 1806 and digital signal processor 1816 are activated at a suitable rate in agreement with the sampling rate previously described, for example, every one hundred (100) ms.

A power source 1818 supplies power for numerous components including the lid position sensor system 1800. The power source 1818 may also be utilized to supply power to other components in the contact lens. A lid position sensor array pattern, processed from analog to digital, may enable activation of the system controller 1812 or a portion of the system controller 1812. Furthermore, the system controller 1812 may control other aspects of a powered contact lens depending on input from the digital signal processor 1808.

An intraocular lens or IOL is a lens that is implanted in the eye and replaces the crystalline lens. It may be utilized for individuals with cataracts or simply to treat various refractive errors. An IOL typically comprises a small plastic lens with plastic side struts called haptics to hold the lens in position within the capsular bag in the eye. Any of the electronics and/or components described herein may be incorporated into IOLs in a manner similar to that of contact lenses.

Although shown and described in what is believed to be the most practical embodiments, it is apparent that departures from specific designs and methods described and shown will suggest themselves to those skilled in the art and may be used without departing from the spirit and scope of the invention. The present invention is not restricted to the particular constructions described and illustrated, but should be constructed to cohere with all modifications that may fall within the scope of the appended claims.

What is claimed is:

1. A method for updating an oscillator frequency of an oscillator residing in a first contact lens, said method comprising:
   receiving by a system controller on the first contact lens at least one signal from an external source providing information allowing for adjustment of the oscillator frequency of the oscillator;
   upon receipt of the at least one signal,
   computing an adjustment to the oscillator frequency based on information contained in the at least one signal,
   adjusting the oscillator frequency according to the computed adjustment, wherein
   the at least one signal includes two signals spaced in time by a predetermined amount from each other;
   the at least one signal includes information regarding a current time;
   wherein calculating the adjustment for the oscillator frequency includes
       the system controller determining a number of transitions in an oscillator output that occurred between the two signals, and
       comparing the number of transitions to a reference transition count.

2. The method according to claim 1, wherein the external source is at least one of a cellular telephone, a cellular telephone tower, an over-the-air broadcast signal, a WiFi base station, a LiFi node, and an ad hoc wireless network node.

3. The method according to claim 1, further comprising:
   updating a clock in the first contact lens to match the current time contained in the at least one signal;
   adjusting the oscillator frequency up when a time on the clock prior to updating was slow compared to the updated time; and
   adjusting the oscillator frequency down when the time on the clock prior to updating was fast compared to the updated time.

4. The method according to claim 3, further comprising recording a base time in memory by the system controller, where the base time is at least one of an initial operation time for the first contact lens and a last update time for the first contact lens, and
   determining an update time differential between the times used to adjust the oscillator frequency of the oscillator,
   determining a run time differential between a time on the clock prior to updating and the base time,
   determining a time drift based on a relationship between the update time differential and the run time differential, and
   adjusting the oscillator frequency of the oscillator based on that relationship.

5. The method according to claim 1, further comprising requesting the at least one signal from the external source.

6. The method according to claim 1, wherein the receiving of the at least one signal includes
   detecting light with the at least one photosensor;
   counting with the system controller a number of transitions of light over a predetermined time period;
   counting with the system controller the number of transitions in the output from the oscillator during the same predetermined time period; and
   normalizing at least one of the transition counts to match a frequency of the other transition count prior to comparing transition counts where the transition count of the light is the information contained in the at least one signal, and
   wherein the light transitions are flickers of the light.

7. The method according to claim 1, wherein
   the external source is indoor lighting having a known frequency,
   the receiving of the at least one signal includes
       detecting the light with at least one photosensor,
       determining whether a brightness of the light matches a light threshold,
       when the brightness matches the light threshold, the method further comprising after receipt of the signal,
           detecting light with the at least one photosensor,
           counting with the system controller the number of transitions of light over a predetermined time period to determine a light frequency,
           normalizing the light frequency to the oscillator frequency prior to comparing the oscillator frequency to information where information is the light frequency.

8. The method according to claim 1, wherein
   the external source is indoor lighting having a known frequency,
   the receiving of the at least one signal includes detecting the light with at least one photosensor,
   the method further comprising after receipt of the signal,
   counting with the system controller the number of transitions of light over a predetermined time period to determine a light frequency,
   normalizing the light frequency to the oscillator frequency prior to comparing the oscillator frequency to information where information is the light frequency.

9. The method according to claim 8, wherein the indoor lighting is at least one of fluorescent lighting and LED lighting.

10. The method according to claim 9, further comprising receiving an input by the first contact lens identifying the known frequency for fluorescent lighting.

11. The method according to claim 10, wherein the input is at least one of detection of a blink pattern template and a transmission from another external source other than the fluorescent lighting.

12. The method according to claim 1, wherein
   the external source is indoor lighting having a known frequency,
   the receiving of the at least one signal includes
       detecting the light with at least one photosensor,
       determining whether a brightness of the light matches a light threshold,
       when the brightness matches the light threshold, the method further comprising after receipt of the signal, detecting light with the at least one photosensor, counting with the system controller the number of transitions of light over a predetermined time period to determine a light frequency, normalizing the oscillator frequency to the lighting frequency prior to comparing the oscillator frequency to information where information is the number of cycles of light.

13. The method according to claim 1, further comprising adjusting a register electrically connected to the oscillator.

14. The method according to claim 1, further comprising adjusting at least one of a variable resistor and a variable capacitor to change the oscillator frequency.

15. The method according to claim 1, further comprising:

transmitting a synch signal to a second contact lens having at least one of a coded signal and a plurality of zeros and ones.

16. The method according to claim 15, further comprising:

receiving by the first contact lens a drift level from the second contact lens, transmitting from the first contact lens to the second contact lens a second synch signal having at least one of a coded signal and a plurality of zeros and ones, receiving by the first contact lens an updated drift level from the second contact lens, comparing by the first contact lens the drift level and the updated drift level, and, when a difference between the drift levels is greater than a drift threshold, repeating transmitting the second synch signal from the first contact lens to the second contact lens.

17. A method for synchronizing frequencies between two lenses, said method comprising:

transmitting from a first contact lens a synch signal to a second contact lens having at least one of a coded signal and a plurality of zeros and ones;

adjusting an oscillator frequency on the second contact lens based on the synch signal received from the first contact lens;

transmitting a drift level from the second contact lens to the first contact lens, transmitting from the first contact lens to the second contact lens a second synch signal having at least one of a coded signal and a plurality of zeros and ones, adjusting the oscillator frequency on the second contact lens based on the second synch signal received from the first contact lens, transmitting an updated drift level from the second contract lens to the first contact lens, comparing drift levels with the first contact lens, and when a difference between drift levels is greater than a drift threshold, repeating transmitting the second synch signal from the first contact lens to the second contact lens, adjusting the oscillator frequency on the second contact lens in response to the second synch signal, transmitting the updated drift level from the second contact lens to the first contact lens.

\* \* \* \* \*